(12) United States Patent
Mueck

(10) Patent No.: US 7,688,245 B2
(45) Date of Patent: Mar. 30, 2010

(54) METHOD FOR QUANTIZING OF SIGNAL VALUES AND QUANTIZER

(75) Inventor: Markus Dominik Mueck, Unterhaching (DE)

(73) Assignee: Infineon Technologies AG, Neubiberg (DE)

(*) Notice: Subject to any disclaimer, the term of this patent is extended or adjusted under 35 U.S.C. 154(b) by 63 days.

(21) Appl. No.: 12/171,696

(22) Filed: Jul. 11, 2008

(65) Prior Publication Data

US 2010/0007543 A1   Jan. 14, 2010

(51) Int. Cl.
    *H04N 7/26* (2006.01)
(52) U.S. Cl. .................. 341/200; 386/111; 375/240.03; 382/244
(58) Field of Classification Search .............. 341/200; 386/111; 375/240.02, 3, 12, 16; 382/244–251
    See application file for complete search history.

(56) References Cited

U.S. PATENT DOCUMENTS

| | | | |
|---|---|---|---|
| 3,305,855 A | | 2/1967 | Kaneko |
| 4,791,483 A | * | 12/1988 | Miller .................. 375/240.01 |
| 4,979,187 A | * | 12/1990 | Aoki et al. .................. 375/245 |
| 5,053,771 A | | 10/1991 | McDermott |
| 5,115,241 A | * | 5/1992 | Ishikawa .................. 341/143 |
| 6,381,705 B1 | | 4/2002 | Roche et al. |
| 6,388,588 B2 | * | 5/2002 | Kitamura .................. 341/67 |
| 7,133,473 B1 | | 11/2006 | Lou et al. |
| 7,274,750 B1 | | 9/2007 | Mueller |
| 7,295,144 B1 | | 11/2007 | Karthik et al. |
| 7,301,999 B2 | * | 11/2007 | Filippini et al. ........ 375/240.03 |
| 2001/0035833 A1 | * | 11/2001 | Kitamura .................. 341/67 |
| 2004/0071079 A1 | | 4/2004 | Han |
| 2004/0252038 A1 | | 12/2004 | Robinson et al. |
| 2004/0264510 A1 | | 12/2004 | Labs et al. |
| 2005/0018787 A1 | | 1/2005 | Saed |
| 2005/0041761 A1 | | 2/2005 | Chen et al. |

(Continued)

FOREIGN PATENT DOCUMENTS

EP   0 991 239 A2   4/2000

(Continued)

OTHER PUBLICATIONS

3GPP TS 36.211 V8.0.0 (Sep. 2007); Technical Specification; 3rd Generation Partnership Project; Technical Specification Group Radio Access Network; Evolved Universal Terrestrial Radio Access (E-UTRA); Physical channels and modulation (Release 8).

(Continued)

*Primary Examiner*—Lam T Mai
(74) *Attorney, Agent, or Firm*—Dickstein, Shaprio, LLP.

(57) ABSTRACT

A method for quantizing signal values of a signal received or to be transmitted via a radio interface including quantizing signal values that lie within a first value range according to a first quantization having a multiplicity of quantization steps wherein the quantization step width between two quantization steps differs from a linear quantization with the same number of quantization steps at most by the step width of the linear quantization with the same number of quantization steps; and quantizing signal values that lie within a second value range according to a second quantization having a multiplicity of quantization steps wherein the quantization step width between two quantization steps is larger than the quantization step width between two quantization steps of the first quantization.

25 Claims, 12 Drawing Sheets

U.S. PATENT DOCUMENTS

| | | |
|---|---|---|
| 2005/0069054 A1 | 3/2005 | Zhidkov |
| 2006/0056531 A1 | 3/2006 | Li et al. |
| 2006/0119492 A1 | 6/2006 | Kim |
| 2006/0140303 A1 | 6/2006 | Egashira et al. |
| 2006/0158366 A1 | 7/2006 | Kim |
| 2006/0215780 A1 | 9/2006 | Yeon et al. |
| 2006/0222094 A1 | 10/2006 | Makhlouf et al. |
| 2007/0258531 A1 | 11/2007 | Chen et al. |
| 2007/0258544 A1 | 11/2007 | Cleveland et al. |

FOREIGN PATENT DOCUMENTS

| | | | |
|---|---|---|---|
| EP | 1 041 790 A2 | 10/2000 | |
| EP | 1 473 837 B1 | 8/2006 | |
| JP | 08-046660 A | 2/1995 | |
| JP | 7-336322 A | 12/1995 | |
| JP | 09-069776 A | 3/1997 | |
| JP | 2003-087070 A | 3/2003 | |
| JP | 2003-230136 A | 8/2003 | |
| JP | 2005-184359 A | 7/2005 | |
| JP | 2005-266458 A | 9/2005 | |
| KR | 10 2004 0027153 A | 4/2004 | |
| WO | WO-00/28667 A1 | 5/2000 | |
| WO | WO-2004/098063 A1 | 11/2004 | |
| WO | WO-2006/099083 A1 | 9/2006 | |
| WO | WO-2006/107911 A2 | 10/2006 | |
| WO | WO-2007/023923 A1 | 3/2007 | |
| WO | WO-2007/056774 A1 | 5/2007 | |
| WO | WO-2007/094832 A2 | 8/2007 | |
| WO | WO-2007/106454 A1 | 9/2007 | |

OTHER PUBLICATIONS

Specification of an 20 MSamples per Second A/D Converter, ENOB 11.2 bits, http://www.st.com/stonline/products/literature/ds/8472/tsa1204.pdf.; www.st.com, Dec. 2006, Rev 4, pp. 1-31.

3GPP TS 36.101 V1.0.0 (2007-12); Technical Specification; 3rd Generation Partnership Project; Technical Specification Group Radio Access Network; Evolved Universal Terrestrial Radio Access (E-UTRA); User Equipment (UE) radio transmission and reception; (Release 8).

ITU-T Telecommunication Standardization Sector of ITU; "G.711 General aspects of digital transmission systems (Audio Code—mu-law and A-law)".

"A-Law and mu-Law Companding Implementations Using the TMS320C54x"; Copyright © 1997, Texas Instruments Incorporated.

"G711 Codec—Quantize narrowband speech input signals"; ©1984-2008 The MathWorks, Inc.; document retrieved from http://www.mathworks.com/access/helpdesk/help/toolbox/dspblks/index.html?/access/helpdesk/help/toolbox/dspblks/ref/g711codec.html &http://www.google.com/search?g=g711codec.html&rls=com.microsoft:de:IE—SearchBox&ie=UTF—8&oe=UTF—8 &sourceid=ie7&rlz=1I7GFRC.

"G711 codec process"; VoIPForo.com; retrieved Apr. 23, 2008 from http://www.en.voipforo.com/codec/codecs-g711-alaw.php.

* cited by examiner

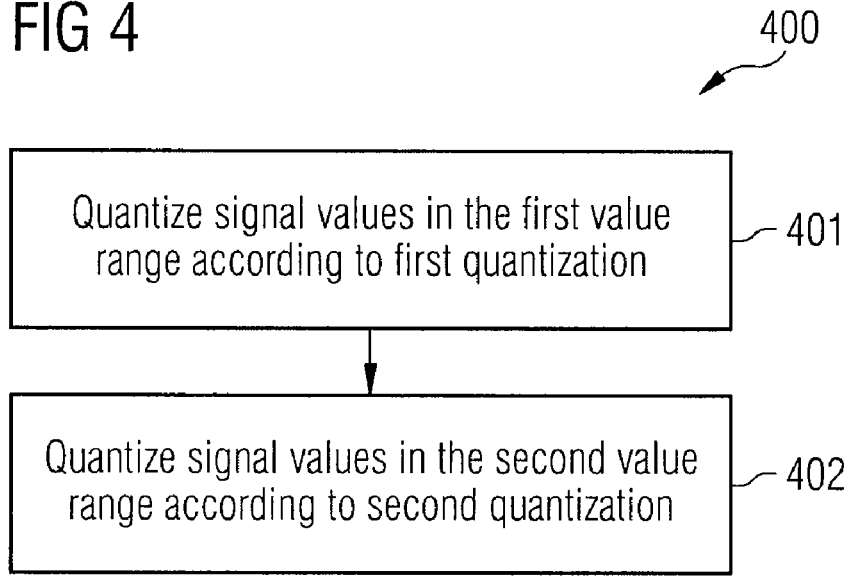
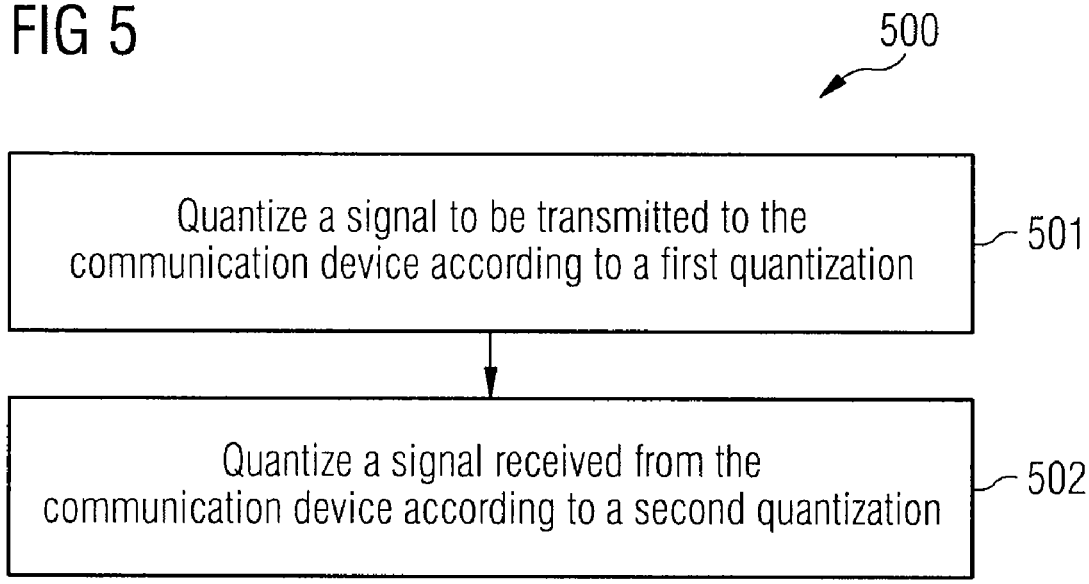

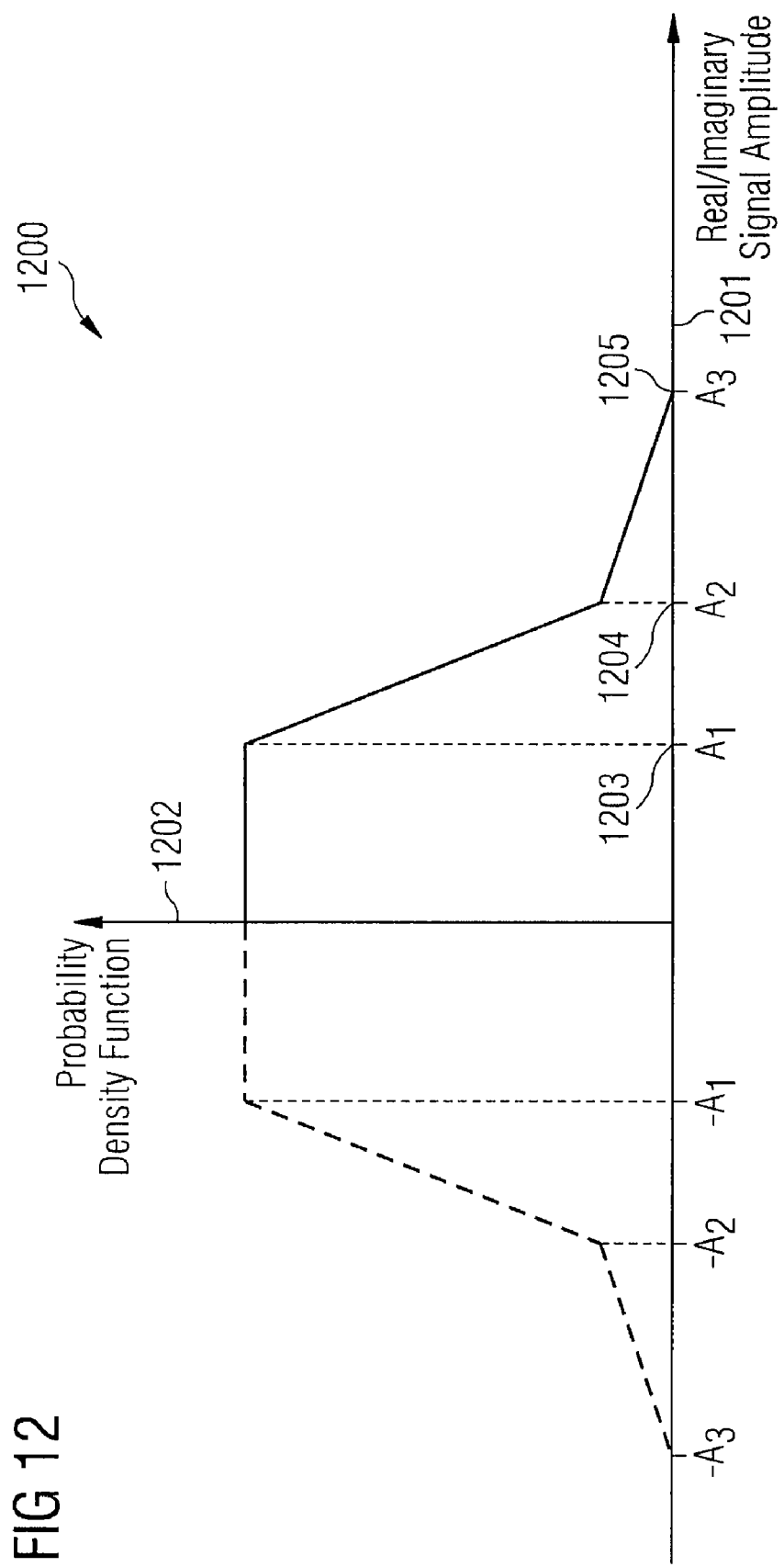

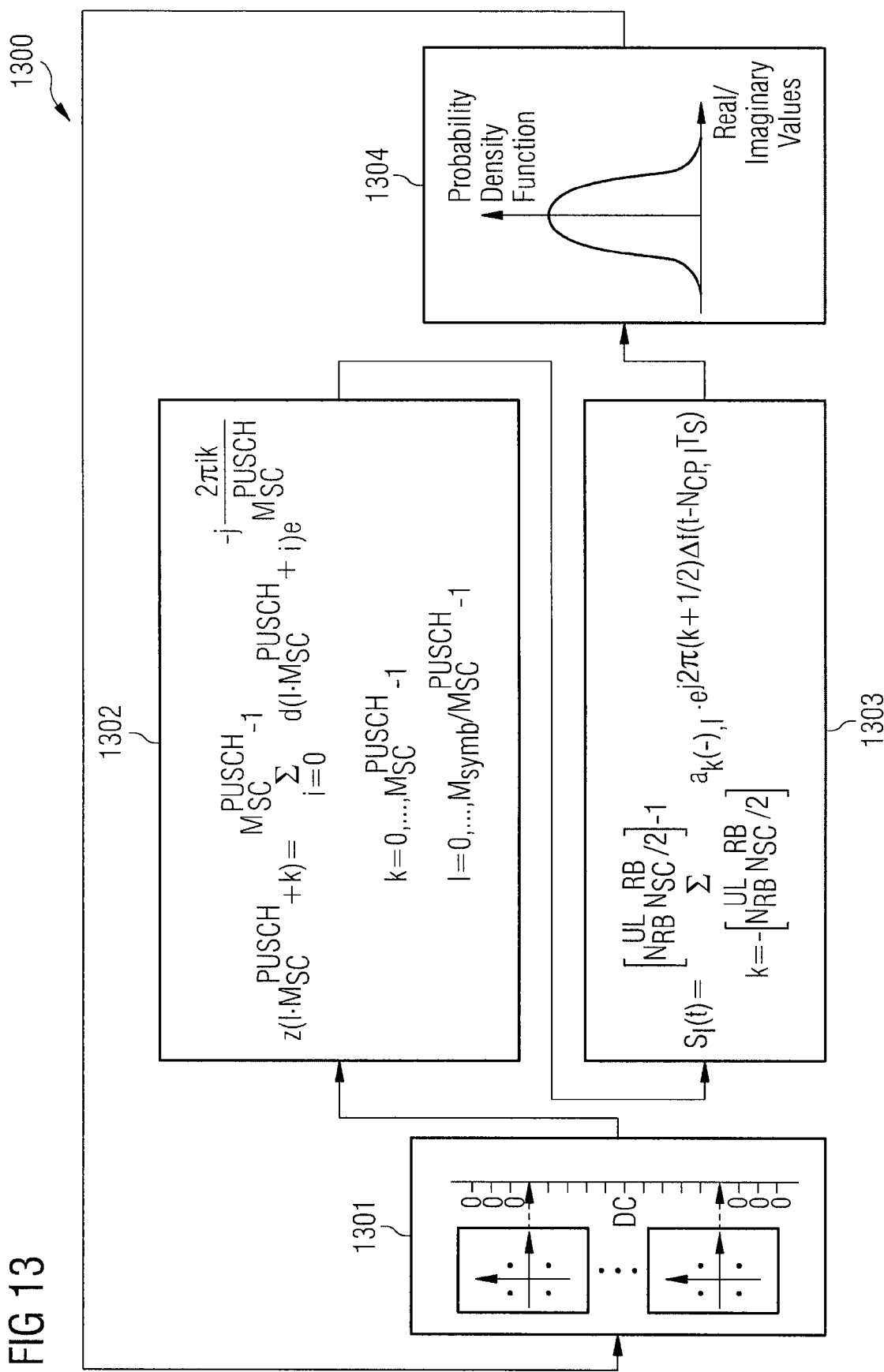

US 7,688,245 B2

METHOD FOR QUANTIZING OF SIGNAL VALUES AND QUANTIZER

TECHNICAL FIELD

Embodiments relate generally to a method for quantizing of signal values and a quantizer.

BACKGROUND

In radio communication systems, analog to digital and digital to analog conversions are carried out. Inherent to these conversions, a quantization of signal values is performed. The type and design of a quantization that is used affects the quantization error (and thus the signal to noise ratio) and the power consumption of the circuitry performing the quantization. Since a low power consumption and a low quantization error is desired, there is a need for improved quantization methods.

BRIEF DESCRIPTION OF THE DRAWINGS

In the drawings, like reference characters generally refer to the same parts throughout the different views. The drawings are not necessarily to scale, emphasis instead generally being placed upon illustrating the principles of various embodiments. In the following description, various embodiments are described with reference to the following drawings, in which:

FIG. 4 illustrates a method for quantizing signal values of a signal received or to be transmitted via a radio interface.

FIG. 5 illustrates a method for quantizing signals received from a communication device or to be transmitted to a communication device.

FIG. 12 shows a function graph according to an embodiment.

FIG. 13 shows a flow diagram according to an embodiment.

DESCRIPTION

In cellular communication systems, a wireless link between a mobile terminal (also called User Equipment, UE) and a base station is used for exchanging information. For that reason, the information to be exchanged (such as text messages, video clips, etc.) is transformed into a radio signal which is suitable for the wireless transmission.

Typically, such a transformation process may be split into the following steps (the order given is for transmission; the inverse order applies for the reception):

i) base-band processing (involving the digital treatment of data to be transmitted, such as channel coding, etc.), ii) digital-to-analog (D/A) conversion for transmission (or analog-to-digital (A/D) conversion for reception), and iii) radio frequency (RF) processing.

In one embodiment, the focus is on the second step above, i.e. on the A/D conversion and/or D/A conversion.

Since the power consumption of the A/D and D/A components are closely linked to the characteristics of their input signals and the size of their quantization errors, the following issues arise when one aims at minimizing the power consumption of A/D and D/A components, for example in a mobile terminal and a base station:

1) How to choose an optimum set of A/D and D/A components in both the base station and the mobile terminal in order to i) minimize the power consumption at a given average quantization error level or ii) minimize the average quantization error at a given power consumption or iii) a mixture of these two, 2) How to choose the optimum A/D and/or D/A quantization strategy (i.e. the optimum relationship between input and output of the A/D (and/or D/A) components) taking the input signal characteristics into account as they occur in the mobile communication system.

In one embodiment, a mobile radio communication system according to the framework of the 3GPP Long Term Evolution (LTE) standard is used (however, any other mobile radio communication technology e.g. in accordance with any other provided mobile radio communication standard may be provided in an alternative embodiment). By way of example, according to one embodiment, a quantization method for the specific 3GPP LTE uplink modulation scheme which combines a traditional OFDM (Orthogonal Frequency Division Multiplexing) modulator (based on an Inverse Fourier Transformation) with a precoding matrix containing Fourier Transformation coefficients may be provided.

A standard linear quantization approach may be used for a quantization independent of the input signal characteristics. The step size of the quantization may then be for example be chosen in function of the input signal power.

Figure 1:
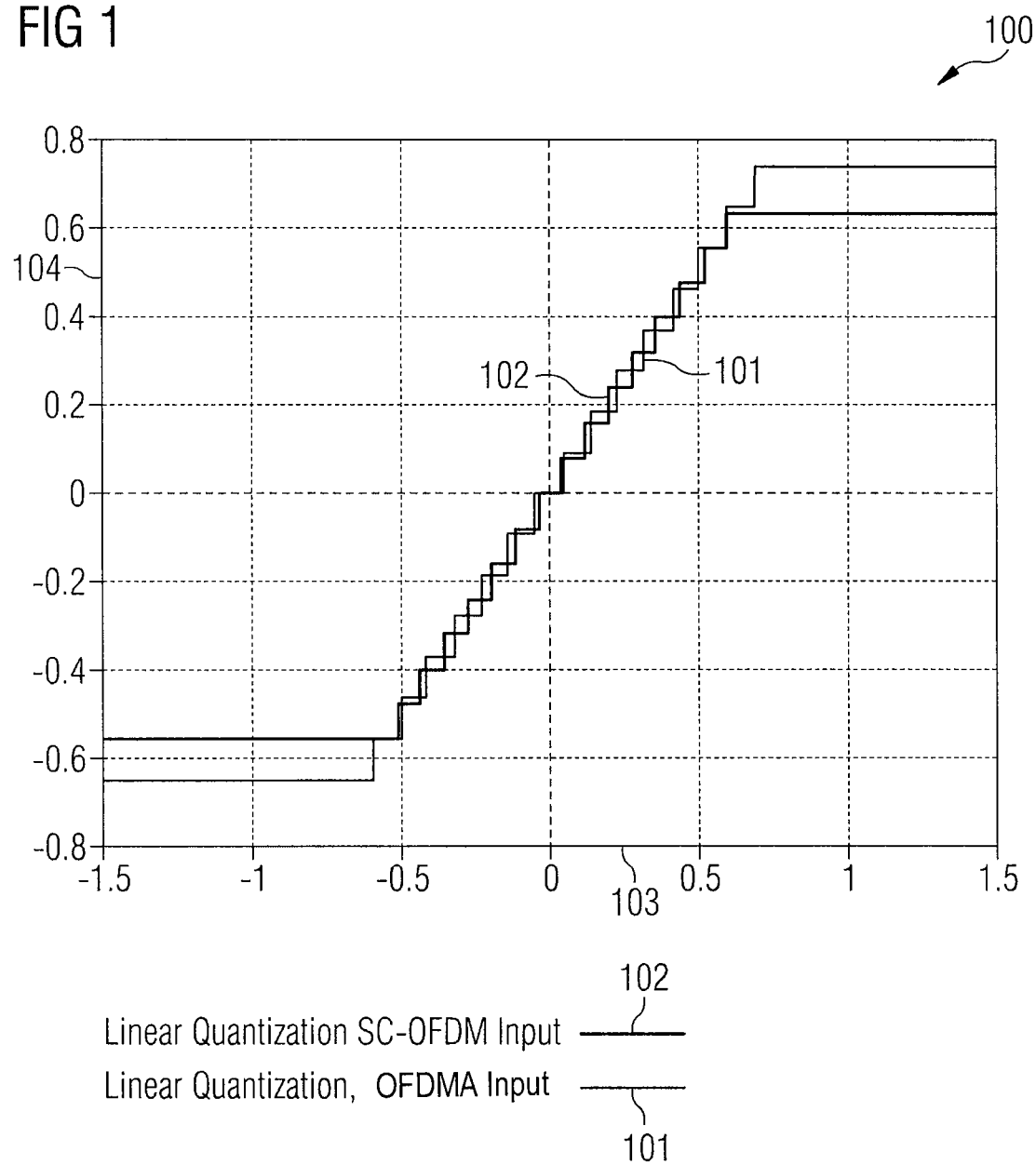
FIG. 1 illustrates the transfer function of a linear quantizer in the framework of the 3GPP LTE standard for uplink and downlink.

FIG. 1 illustrates the transfer function of a linear quantizer in the framework of the 3GPP LTE standard for uplink and downlink. In a diagram 100, the relationship of input values (illustrated along the x-axis 103) and output values (illustrated along the y-axis 104) is shown for a linear quantization that is for example used for input values of a signal according to SC-OFDM (curve 102) and for a linear quantization that is for example used for input values of a signal according to OFDMA (curve 101).

The optimum step size for uplink and downlink may be different at an identical power level due to different signal characteristics. For reasons of simplicity, 16 quantization steps are shown in FIG. 1.

The key issue may be seen in the distribution of the input signal values to the inherent quantization of the A/D and/or D/A converters.

Figure 2:
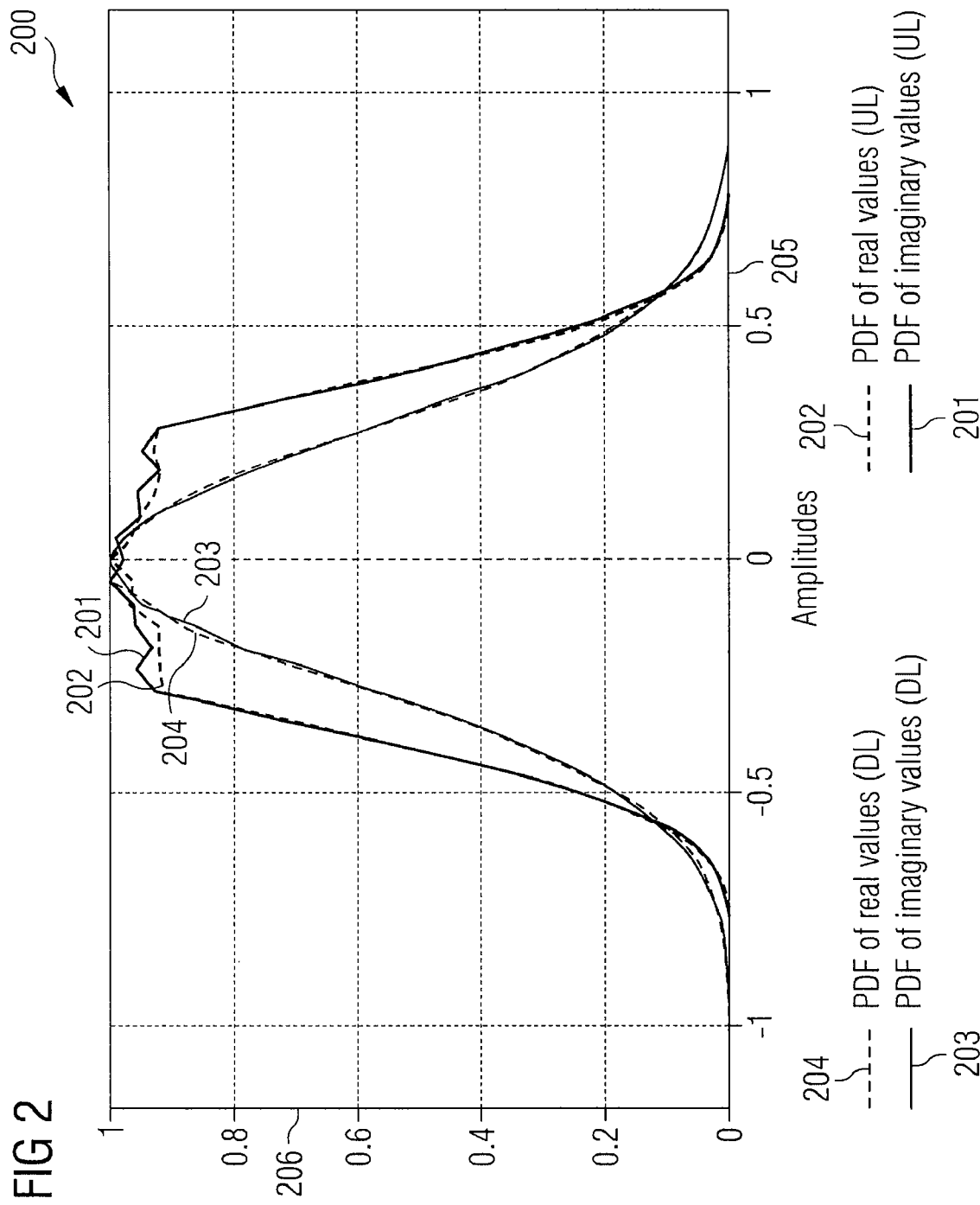
FIG. 2 shows a diagram with the normalized probability density functions (PDFs) of uplink and downlink signals in a typical LTE configuration.

FIG. 2 shows a diagram 200 with the normalized probability density functions (PDFs) of uplink and downlink signals in a typical LTE configuration. The power levels are chosen such that the average power on used signal carriers is 1.

Along the x-axis 205, the signal values are shown. Along the y-axis 206, the probability is shown. The diagram 200 shows the probability distribution function of the imaginary values of an uplink transmission signal (curve 201), the real values of the uplink transmission signal (curve 202), the imaginary values of downlink transmission signal (curve 203), and the real values of the downlink transmission signal (curve 204).

A probability distribution function (PDF) is a function with the integral from −infinity to +infinity being equal to 1. In the figures showing PDFs, the PDFs have been scaled such that the max. value is 1—for two reasons: i) it facilitates the interpretation of the figure and ii) it avoids the numerical calculation of the integral, which can be numerically instable and thus erroneous, i.e. a potentially wrong result is avoided. Thus, where applicable, the term "probability density function" refers to a probability density function normalized in this way, i.e. to a "normalized probability density function". Further, when according to one embodiment a normalized probability density function is generated or used, this may also mean that a (normal, i.e. with integral 1) probability density function is generated or used and vice versa.

From the distribution graphs shown in FIG. 2, the properties of the usage of a linear quantization may be seen:

1) With the objective to minimize the mean square quantization error, the linear quantization approach is optimum with a constant input signal distribution over the quantization range. A non-constant PDF as shown in FIG. 2, however, leads to different quantization requirements: the quantization error should be as small as possible over the value ranges that occur the most often. The quantization error constraints can, on the other hand, be reduced over value ranges that occur only very rarely. Thus, the standard approach based on linear quantization leads to a sub-optimum solution. This intuitive considerations are used as a basis for a rigorous derivation of the optimum quantization step sequence in one embodiment. At a fixed number of quantization steps, better noise levels can be obtained with an optimized quantization step set which can lead in some cases also to a reduced number of required quantization bits and thus a considerably reduced power consumption of the components including a quantization.

2) Conventionally, the same quantization type (i.e. linear quantization) is used for uplink and downlink signals. In LTE, for example, however, as can be seen from FIG. 2, the probability distributions are different for uplink signals and downlink signals. Thus, according to one embodiment, the following specific configurations are taken into account:

a) User Equipment (UE): The A/D conversion is in one embodiment adapted to the reception of downlink signals. The corresponding choice of an optimum quantization step sequence is for example based on the form of the downlink PDF as it is illustrated in FIG. 2. For standard OFDM symbols, the PDFs of the corresponding real and imaginary time domain signals are quasi-Gaussian. The D/A conversion, on the other hand, is in one embodiment adapted to the transmission of uplink signals, e.g. to 3GPP LTE uplink signals or uplink signals with characteristics similar to 3GPP LTE uplink signals (e.g. with respect to their signal value distribution).

The choice of the optimum quantization step sequence is for example based on the form of the uplink PDF as it is illustrated above. As can be seen, in the above example, this PDF is near-constant over a value range around zero (approximatively −0.3 ... +0.3 of the average power used in this example) and decreases then quickly. This means a near-linear quantization is in one embodiment used as a suitable quantization for the near-constant value range while a "rougher" quantization, i.e. a quantization with larger quantization step width, is considered in one embodiment as being sufficient for the remaining values (i.e. the larger signal values).

b) Base stations (BS): The A/D conversion is in one embodiment adapted to the reception of uplink signals, while the D/A may be adapted to the transmission of downlink signals. This means that in one embodiment, the component configuration is inversely configured compared to the mobile terminal with regard to the quantization method used.

As explained above, it has been found that the typical implementation of the A/D and/or D/A inherent (linear) quantization is sub-optimum e.g. in a 3GPP LTE context and may lead (in comparison to a specifically optimized quantization) to i) a higher mean-square-quantization error and ii) higher requirements on the number of quantization bits and thus a higher power consumption in order to fulfil the mean-square quantization error targets.

For the latter, it should be noted that the power consumption of a A/D component is typically proportional to two to the power of ENOB with ENOB being the effective number of bits. This means that each additional bit may be expected to approximately double the power consumption of the A/D component. For example, the expected A/D power consumption of a suitable component offering 20 Megasamples per second at an ENOB of 11.2 bits may be 120 mW. A reduction on the ENOB requirements may thus be expected to lead to power consumption reductions of multiple tens of mW.

Figure 3:
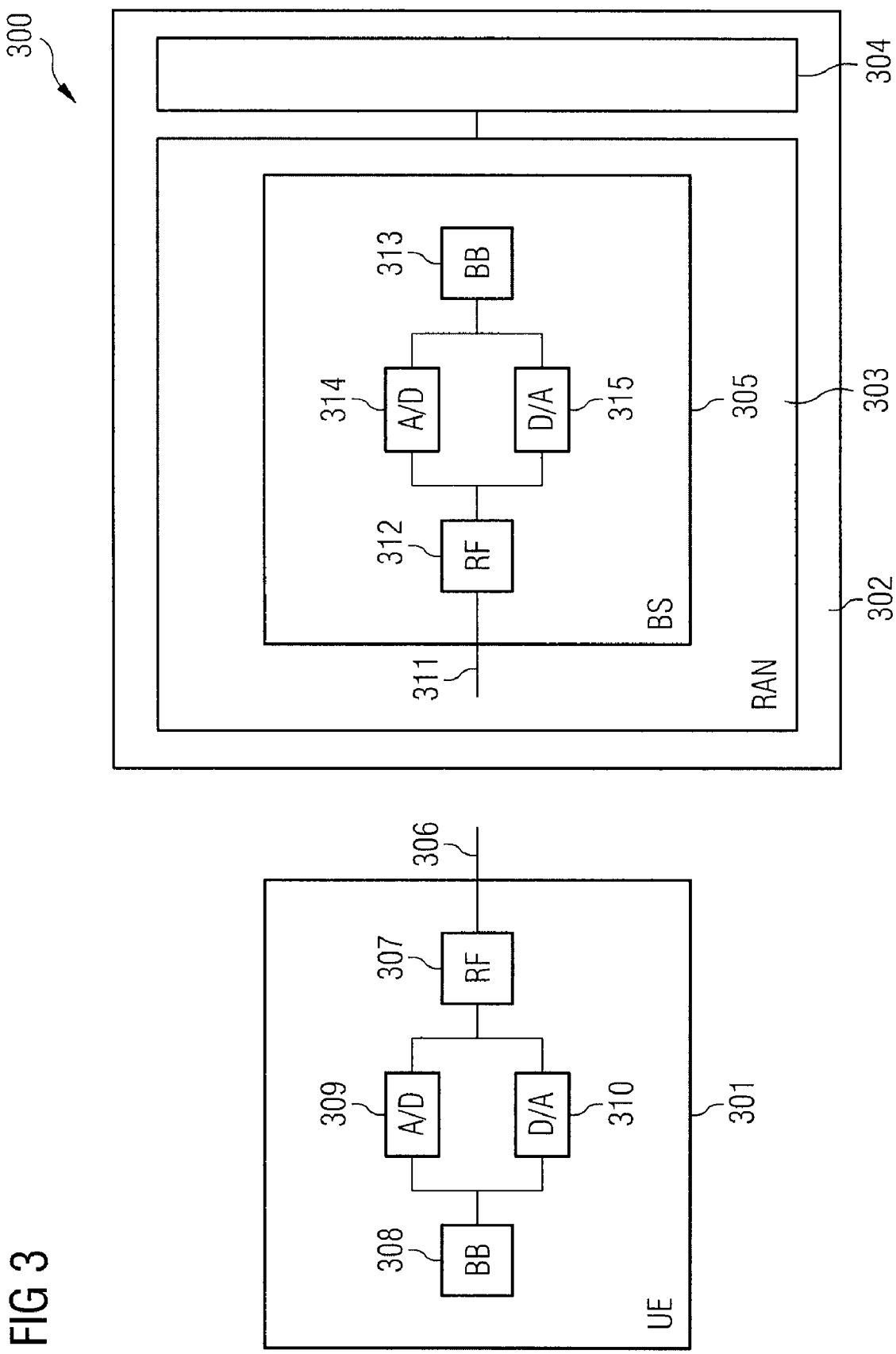
FIG. 3 shows a communication system according to an embodiment.

FIG. 3 shows a communication system according to an embodiment.

The communication system is in this example a mobile radio communication system. A mobile terminal 301 may communicate with a mobile radio communication network 302 which is for example coupled to a core network 304. The mobile radio communication network includes a radio access network 303. The mobile radio communication network may include a base station 305. The mobile terminal 301 exchanges data with the base station 305 using radio signals. To do this, the mobile terminal 301 includes an antenna 306 that is coupled with radio frequency front-end components 307 (e.g. radio frequency circuitry). The radio frequency front-end components 307 are coupled with base band circuitry 308, wherein signals transmitted from the radio frequency front-end components 307 to the base band circuitry 308 are converted from analog to digital by first A/D converting components 309 and signals transmitted from the base band circuitry 308 to the radio frequency front-end components 307 are converted from digital do analog by first D/A converting components 310. The front-end components 307 for example comprise one or more mixers and/or one or more filters to extract the base-band signal from the received signal (for receiving) or to generate a transmit signal in the frequency band to be used for transmission based on the base-band signal (for transmitting). The base-band band circuitry 308 for example process the (digital) base-band signal, for example, in OFDM, carry out the inverse fast Fourier transformation (for transmitting) or the fast Fourier transformation (for receiving).

Similarly, the base station 305 includes an antenna 311 that is coupled with radio frequency front-end components 312. The radio frequency front-end components 312 are coupled with base band circuitry 313, wherein signals transmitted from the radio frequency front-end components 312 to the base band circuitry 313 are converted from analog to digital by second analog to digital by A/D converting components 314 and signals transmitted from the base band circuitry 313 to the radio frequency front-end components 312 are converted from digital do analog by second D/A converting components 315.

In one embodiment, the quantization carried out in the first A/D converting components 309, the first D/A converting components 310, the second A/D converting components 314 and/or the second D/A converting components 315 is carried out as it is illustrated in FIG. 4.

In FIG. 4, a method for quantizing signal values of a signal received or to be transmitted via a radio interface is illustrated.

In 401, signal values are quantized that lie within a first value range according to a first quantization having a multiplicity of quantization steps wherein the quantization step width between two quantization steps differs from a linear quantization with the same number of quantization steps at most by the step width of the linear quantization with the same number of quantization steps. According to one embodiment, the first quantization may be regarded as a pseudo-linear quantization.

In 402, signal values are quantized according to a second quantization that lie within a second value range according to a second quantization having a multiplicity of quantization steps wherein the quantization step width between two quantization steps is larger than the quantization step width between two quantization steps of the first quantization. The second quantization is in one embodiment a non-linear quantization.

The order shown in FIG. 4 is only for illustration purposes, the quantization of signal values in the first value range or in the second value range does not have to be carried out in a specific order but may be carried out at any order or simultaneously. A multiplicity means for example more than two.

In one embodiment, the quantizing of values means the representation of the values in a set of discrete values, i.e., for example, the mapping of values in a first set (e.g. a value range of analog or discrete values) to a second set (e.g. a value range of discrete values) wherein the second set is smaller than the first set, i.e. includes fewer possible values than the first set. The values that are quantized may be for example analog values (e.g. in the case of A/D conversion) i.e. values from a continuous value range. The values that are quantized may also be from a set of discrete values (e.g. in the case of D/A conversion). In this case, for example, values from a larger set of discrete values (e.g. a set with higher resolution of the values) are mapped to a smaller set of discrete values (e.g. a set with lower resolution of the values).

In one embodiment, the signal values in the first value range occur more often than the signal values in the second value range (as it is for example reflected in the probability distribution function of the signal values). Therefore, in one embodiment, different quantizations are used to take account of this difference of the probability of the signal values. For example, signal values that are not as likely to occur as others are quantized with less accuracy and the mean quantization error can still be kept low since higher quantization errors are only introduced for signal values which seldomly occur.

In one embodiment, the quantization steps of the first quantization differ from the quantization steps of a linear quantization with the same number of quantization steps at most by the step width of the linear quantization with the same number of quantization steps. The first quantization can therefore be seen as being substantially a linear quantization or as a quasi-linear quantization.

In one embodiment, the absolute values of the signal values in the second value range are larger than the absolute values of the signal values in the first value range. This means that in one embodiment, the second quantization is applied to larger signal values than the first quantization.

In one embodiment, the quantization step width of the second quantization increases with increasing absolute values of the signal values in the second value range. Thus, in one embodiment, the accuracy of the quantization decreases with increasing (absolute values of) signal values.

In one embodiment, the first value range is the value range including the signal values having absolute values which are at most one third of the absolute value of the largest signal value that is expected to be received as an input signal. The largest signal value that is expected is for example the largest signal value that could occur except for outliers, e.g. except for signal values increased due to unpredictable effects, such as noise or interference. Thus, the largest signal value that is expected is for example the largest signal value that can be expected under the assumption that there are no disturbances.

For example, the second value range is the value range including the signal values having absolute values which are higher than one third of the absolute value of the largest signal value that is expected to be received.

In one embodiment, the definition of the first value range is based on an approximation of the probability distribution function of the signal values of the signal.

In one embodiment, the probability distribution function of the signal values of the signal differ from a piecewise linear approximation of the probability distribution function of the signal values by at most 0.1 (in the function values, i.e. in the probabilities). This holds for example for the probability distribution function (and its approximation) being normalized to integral 1 or being normalized to having a maximum value (e.g. at zero) of 1.

In one embodiment, the probability distribution function of the signal values of the signal differ from a piecewise linear approximation of the probability distribution function of the signal values by at most 0.05. This holds for example for the probability distribution function (and its approximation) being normalized to integral 1 or being normalized to having a maximum value (e.g. at zero) of 1.

In one embodiment, the piecewise linear approximation of the probability distribution function is axis-symmetric with respect to the y-axis.

In one embodiment, the first value range is defined such that it corresponds to a value range in which the piecewise linear approximation of the probability distribution function is constant.

In one embodiment, the piecewise linear approximation of the probability distribution function is constant in a first interval between 0 and a first positive value, is linearly decreasing in a second interval between a first positive value and a second positive value and is linearly decreasing in a third interval between the second positive value and a third positive value. For example, the linear decrease in the second interval is more rapid than in the third interval.

In one embodiment, the first value range is defined such that it corresponds to the first interval and the mirrored first interval on the negative part of the x-axis. The second value range is for example defined such that it corresponds to the second interval, the third interval, the mirrored second interval on the negative part of the x-axis and the mirrored third interval on the negative part of the x-axis.

For example, the ratio between the second positive value and the first positive value is at most 11 and/or at least 2. The ratio between the second positive value and the first positive value is for example at most 10.5. In one embodiment, the ratio between the third positive value and the second positive value is at most 2 and/or at least 1.2. The ratio between the third positive value and the second positive value may be for example at most 1.5.

The signal may correspond to the real part or the imaginary part of a complex-valued signal. Accordingly, the first quantization and the second quantization may be applied to both the real components and the imaginary components of the complex-valued signal. The probability distribution functions of the real components and the imaginary components may be different. Accordingly, the approximations of the probability distribution functions of the real components and the imaginary components may be different.

The signal is for example a radio transmission signal (possibly scaled or normalized in the receiving process), for example a radio transmission signal used in a mobile communication system, e.g. according to UMTS (Universal Mobile Telecommunication System), CDMA2000 (CDMA: Code Division Multiple Access), FOMA (Freedom Of Mobile Access), or GSM (Global System of Mobile Communications). In one embodiment, the signal is a radio transmission signal used for UMTS LTE uplink transmission. For example, the signal is in one embodiment a radio transmission signal according to SC-OFDM (Single Carrier Orthogonal Frequency Division Multiplexing). In one embodiment, the signal is a signal according to an OFDM transmission (or generally a transmission including a fourier transformation, e.g. in the receiver, and an inverse fourier transformation, e.g. in the transmitter) with precoding (e.g. carried out before the inverse fourier transformation). The precoding for example includes an interleaving of the data symbols to be transmitted for reducing the peak to average power of the radio signal used for the transmission of the data symbols.

The method according to FIG. 4 is for example carried out by a communication device having a component (e.g. circuitry) that carries out the first quantization and the second quantization. For example, the first A/D components 309, the first D/A components 310, the second A/D components 314 and/or the second D/A components 315 of the communication devices 301, 305 (in this example a mobile terminal and a base station) carry out the quantizations.

In an embodiment, a "circuit" may be understood as any kind of a logic implementing entity, which may be hardware, software, firmware, or any combination thereof. Thus, in an embodiment, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be software being implemented or executed by a processor, e.g. any kind of computer program, e.g. a computer program using a virtual machine code such as e.g. Java. Any other kind of implementation of the respective functions which will be described in more detail below may also be understood as a "circuit" in accordance with an alternative embodiment.

In one embodiment, the mobile terminal 301 and the base station 305 carry out quantizations as illustrated in FIG. 5.

FIG. 5 illustrates a method for quantizing signals received from a communication device or to be transmitted to a communication device.

In 501, a signal to be transmitted to the communication device is quantized according to a first quantization.

In 502, a signal received from the communication device is quantized according to a second quantization.

The order shown in FIG. 5 is for illustration purposes only, the quantization of signals to transmitted and signals received do not have to be quantized in a specific order but may be carried out at any order or simultaneously.

The first quantization may include a quantization step (i.e. a step from one output value to a different output value) at a signal value at which the second quantization does not a include a quantization step and the second quantization may include a quantization step at a signal value at which the first quantization does not a include a quantization step.

This means that in one embodiment, the first quantization and the second quantization are different and, for example, one quantization is not merely a refinement of the other quantization. Each quantization may include at least one quantization step (located at a certain input value and with a certain output value) for which the other quantization does not include a quantization step (located at this input value and having this output value).

In one embodiment, the quantizations are different in that in one of the quantizations there is a relative quantization step width increase or decrease for a certain signal value range (e.g. the quantization step width doubles from quantization step to quantization step) that does not occur for this value range according to the other quantization.

The signal to be transmitted and/or the signal received are for example radio transmission signals (possibly scaled or normalized in the receiving process), for example radio transmission signals used in a mobile communication system, e.g. according to UMTS (Universal Mobile Telecommunication System), CDMA2000 (CDMA: Code Division Multiple Access), FOMA (Freedom Of Mobile Access) or GSM (Global System of Mobile Communications). In one embodiment, one of the signal to be transmitted and the signal received is an uplink radio transmission signal while the other is a downlink radio transmission signal.

In one embodiment, one of the signals is a radio transmission signal used for UMTS LTE uplink transmission. For example, the signal is a radio transmission signal according to SC-OFDM (Single Carrier Orthogonal Frequency Division Multiplexing). The other signal is for example a radio transmission signal used for UMTS LTE downlink transmission.

In one embodiment, a method for quantizing signals received from a communication device or to be transmitted to a communication device is used. The method may include: quantizing signals to be transmitted to the communication device according to a first quantization which is adapted to the probability distribution of the signal values of the signals to be transmitted to the communication device, and quantizing signals received from the communication device according to a second quantization which is adapted to the probability distribution of the signal values of the signals received from the communication device.

For example, in one embodiment, the different properties or characteristics (such as the different probability distribution) of signals received and signals to be transmitted (e.g. uplink and downlink signals), which for example arise due to the usage of different transmission techniques for received signals and transmitted signals (i.e. for the different transmission directions), are taken into account by using a different quantization for signals to be transmitted and received signals.

The first quantization and the second quantization are adapted to the respective probability distributions. For example, the number and the location of the quantization steps and/or the quantization step widths are determined based on the probability distributions or approximations of the probability distributions which are determined.

In one embodiment, the communication device is a mobile terminal or a base station.

In one embodiment, in which the method illustrated in FIG. 5 is carried out by the mobile terminal 301 and the communication device is the base station 305, the method means that the mobile terminal 301 uses different quantizations (in other words different quantization methods or quantization rules)

in uplink and downlink or that the first A/D components 309 uses a different quantization than the first D/A components 310. This is illustrated in FIG. 6.

Figure 6:
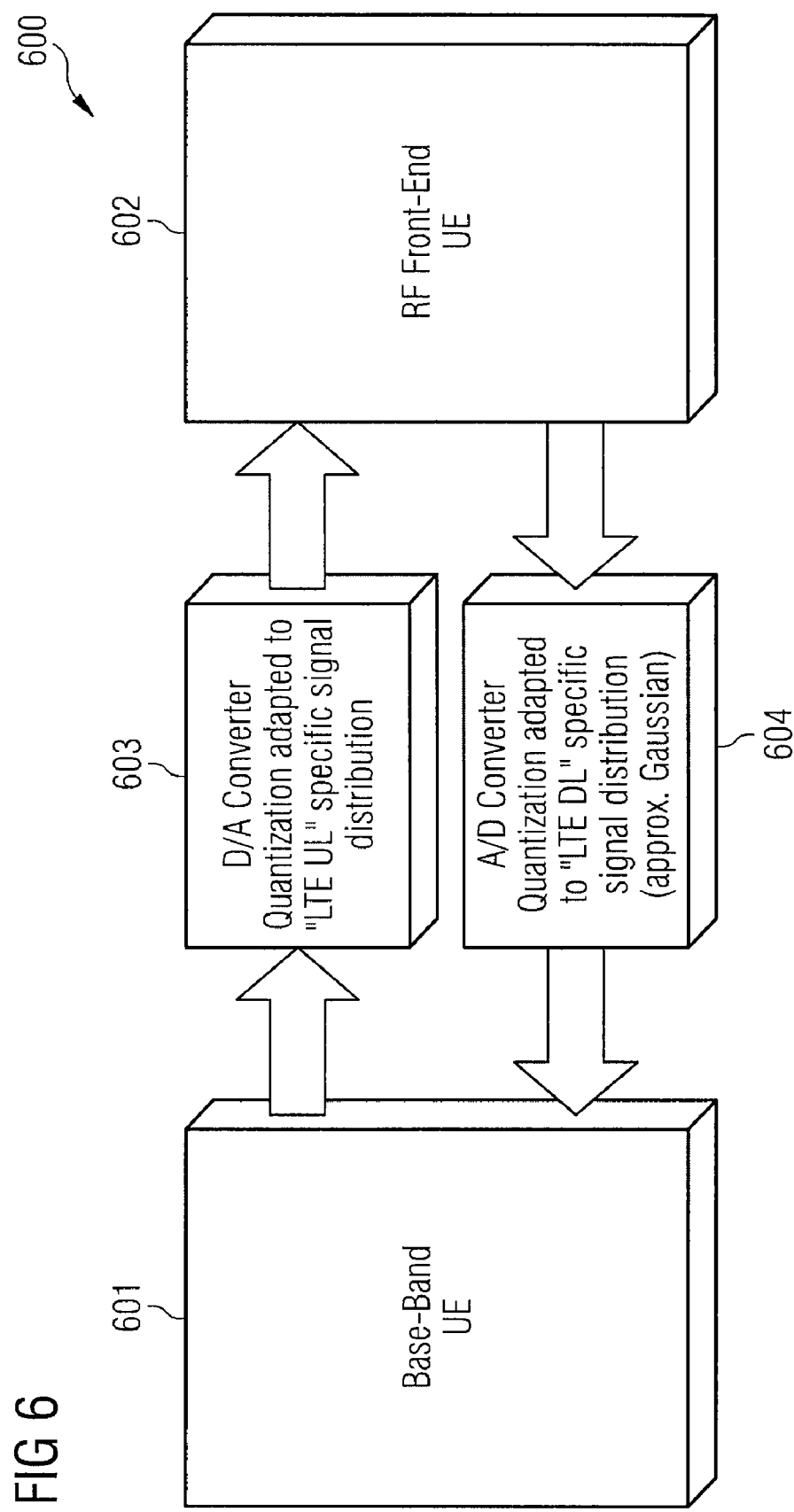
FIG. 6 shows a signal processing arrangement according to an embodiment.

FIG. 6 shows a signal processing arrangement 600 according to an embodiment.

The signal processing arrangement 600 includes a base band circuit 601, a RF front-end circuit 602, a D/A converter 603 and a A/D converter 604. The D/A converter 603 processes uplink signals and the A/D converter 604 processes downlink signals. The D/A converter 603 and the A/D converter 604 are based on different quantizations. This may thus be seen as an asymmetric configuration of the D/A converter 603 and the A/D converter 604.

In the embodiment illustrated in FIG. 6 it is assumed that the quantizations carried out are adapted to the signals (e.g. adapted to the signal probability distributions of the signals) to be quantized in uplink or downlink, respectively. For example, the signals are uplink signals or downlink signals, respectively, which are transmitted in a communication system according to UMTS LTE. Accordingly, the D/A quantization may be adapted to the LTE UL signal characteristics as illustrated in FIG. 2. The A/D quantization may be adapted to the LTE DL signal characterstics which are approximatively Gaussian, i.e. adapted to the (approximatively) Gaussian probability distribution of the downlink signals.

Similarly to FIG. 6, in an embodiment where the method illustrated in FIG. 5 is carried out by the base station 305 and the communication device refers to the base station 301, the base station 305 uses different quantizations in uplink and downlink and the second A/D components 314 uses a different quantization than the second D/A components 315. This is illustrated in FIG. 7.

Figure 7:
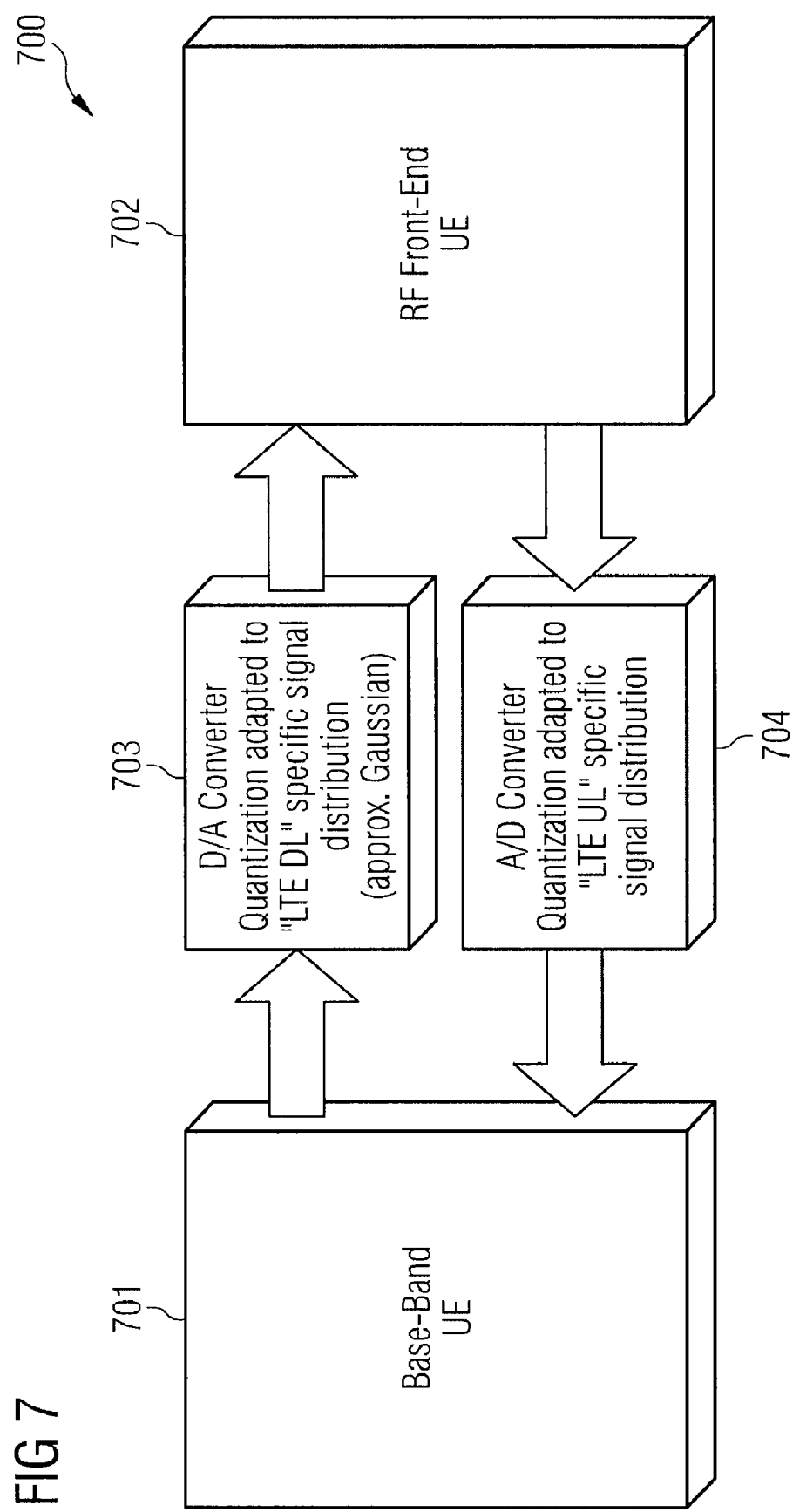
FIG. 7 shows a signal processing arrangement according to an embodiment.

FIG. 7 shows a signal processing arrangement 700 according to an embodiment.

The signal processing arrangement 700 includes a base band circuit 701, a RF front-end circuit 702, a D/A converter 703 and a A/D converter 704. The D/A converter 703 processes downlink signals and the A/D converter 704 processes uplink signals. The D/A converter 703 and the A/D converter 704 are based on different quantizations. This may thus be seen as an asymmetric configuration of the D/A converter 703 and the A/D converter 704.

As above, the quantizations carried out may be adapted to the signals (e.g. to their signal probability distributions) to be quantized in uplink or downlink, respectively. For example, the signals are uplink signals or downlink signals, respectively, which are transmitted in a communication system according to UMTS LTE. Accordingly, the A/D quantization may be adapted to the LTE UL signal characterstics as illustrated in FIG. 2. The D/A quantization may be adapted to the LTE DL signal characteristics which are approximatively Gaussian. The configuration according to FIG. 7 may be seen as the inverse configuration with respect to the configuration according to FIG. 6.

According to the embodiments described with reference to FIGS. 6 and 7, an identical (typically linear) quantization type applied in both the transmission and the reception chain of the mobile terminal and/or the base station is replaced by an asymmetric configuration. This means that in one embodiment, there is not only a distinction between the quantization in the TX (transmit) chain and the RX (receive) chain in the number of quantization steps, but different quantizations are used in the TX chain (i.e. for sending signals) and in the RX chain (i.e. for receiving signals), e.g. different in that each quantization may include a quantization step that is different (in location and/or output value) from any quantization step of the other quantization. Since the A/D conversion typically is more power-consuming compared to the D/A conversion, it may be desirable to use more quantization steps in the D/A conversion than in the A/D conversion.

With regard to practical usage in the presence of multi-path fading, the inputs to the A/D converter may be considered after the convolution by the channel impulse response. Three channel models may be defined for this purpose: The Extended Pedestrian A model (EPA), the Extended Vehicular A model (EVA) and the Extended Typical Urban model (ETU). Simulations show that the corresponding PDFs of the input signals to the A/D converter are very similar for the cases i) no channel convolution, ii) channel model EPA and iii) channel model EVA. For the model ETU, the distribution tends rather towards a Gaussian distribution. The quantization may be adapted accordingly to the respective scenario. However, when only one A/D converter with a fixed quantization step set is used, the quantization may be adapted to the needs of the EPA/EVA/no-channel context.

Figure 8:
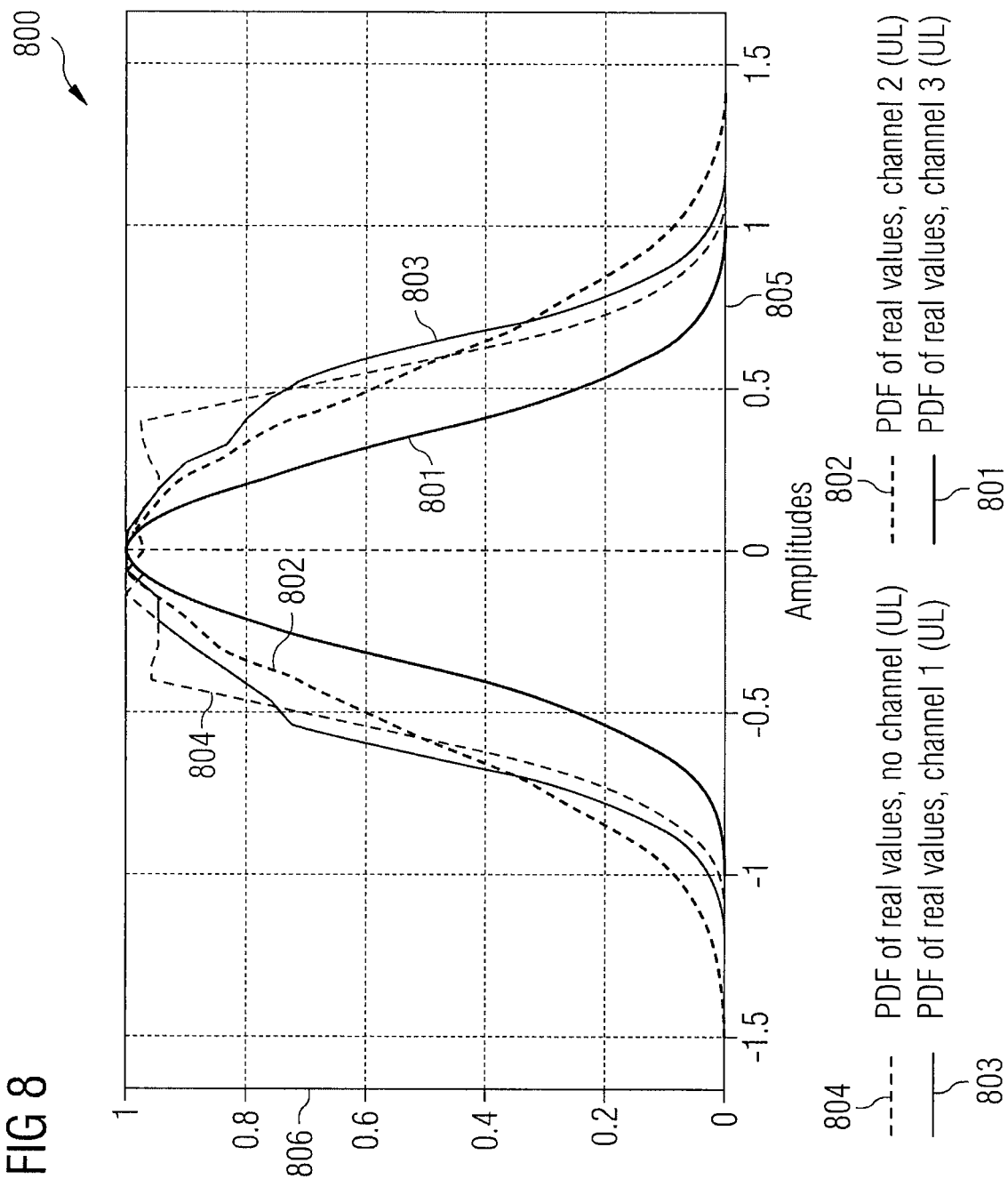
FIG. 8 shows a diagram with the normalized probability density functions of signal examples for a multi-path environment.

FIG. 8 shows a diagram 800 with the normalized probability density functions (PDFs) of signal examples, for example of signals input to the A/D converter, for a multi-path environment.

Along the x-axis 805, the signal values are shown. Along the y-axis 806, the probability is shown. The diagram 800 shows the probability distribution function of the real values of an uplink transmission signal in a multi-path environment with no channels (curve 804), with one channel (curve 803), with two channels (curve 802), and with three channels (curve 801).

In the following, generic rules for choosing the quantization steps adapted to the uplink signal according to one embodiment are described.

A generic rule to follow for choosing the uplink quantization approach (D/A quantization in the mobile terminal 301 and A/D quantization in the base station 305) may be obtained by considering the signal distribution for various LTE parameter sets. For example, the number of carriers can be changed from 6 resource blocks (RBs) up to 110 resource blocks in the frequency domain. The term "resource block" (RB) in one embodiment refers to the resource block as they are defined according to 3GPP LTE, e.g. Release 8.

Figure 9:
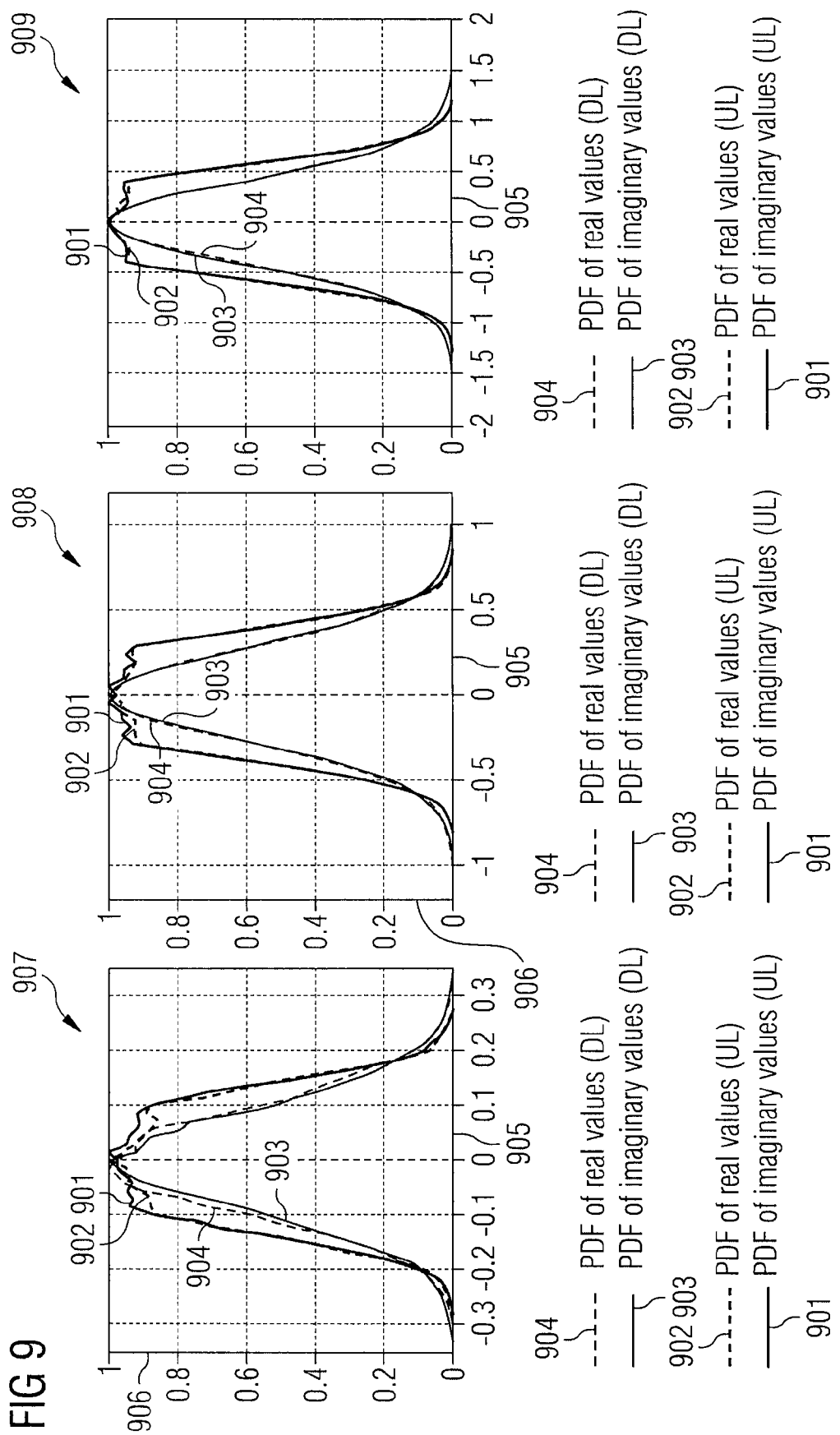
FIG. 9 shows three diagrams with the normalized probability density functions of uplink and downlink signals in an LTE configuration.

The resulting signal distributions for the extreme cases (6 and 110 resource blocks in the frequency domain) as well as an intermediate case (50 resource blocks in the frequency domain) are illustrated in FIG. 9.

FIG. 9 shows three diagrams 907, 908, 909 with the normalized probability density functions (PDFs) of uplink and downlink signals in an LTE configuration.

Along the respective x-axis 905, the signal values are shown. Along the respective y-axis 906, the probability is shown. The three diagrams 907, 908, 909 show the probability distribution function of the imaginary values of an uplink transmission signal (curves 901), the real values of the uplink transmission signal (curves 902), the imaginary values of downlink transmission signal (curves 903), and the real values of the downlink transmission signal (curves 904), wherein the first diagram 907 shows these signals for six resource blocks, the second diagram 908 shows these signals for 50 resource blocks, and the third diagram 909 shows these signals for 110 resource blocks.

In the representations in FIG. 9, the signal power is chosen such that the average power of a used carrier is '1' while the power of unused carriers is '0'. That explains, for example, why the amplitude value range of the right side PDF is larger by a factor about $\sqrt{110/6} \sim 4.3$.

Following the illustration in FIG. 9, signal distributions for the uplink (UL) case (for both the real and imaginary parts) may be observed that are close to a constant distribution over a value range from approx.

$$-\frac{\max}{3} \cdots +\frac{\max}{3},$$

where "max" is the approximate maximum observed amplitude as identified in the upper graphs (approx. +/−0.3 for 6 RBs, approx. +/−1 for 50 RBs, approx. +/−1.3 for 10 RBs, etc.).

Accordingly, in one embodiment, uplink quantization is carried out according to the following:

1) The quantization steps (for D/A in the transmission chain of the mobile terminal and for the A/D in the reception chain of the base station) of the relevant D/A and/or A/D converters is chosen to be approximately linear in the amplitude region of $$-\frac{\max}{3} \cdots +\frac{\max}{3}.$$

2) Beyond the value range of $$-\frac{\max}{3} \cdots +\frac{\max}{3},$$

the quantization step size is chosen such that it increases considerably from step to step (in the direction of increasing absolute values of the input values).

3) In one embodiment, in contrast to a quantization optimization procedure which leads to a quantization amplitude that is non-zero for a near-zero input (due to the dissymmetry of the quantization steps on the positive value range and the negative value range: with 'N=2^M' quantization steps with 'M' integer, there are typically 'N/2−1' negative quantization amplitudes, 'N/2' positive ones and the zero amplitude), the quantization amplitude of near zero-inputs is chosen to be zero. This may be of advantage in the synchronization function since DC-offsets may be a problem in this case.

Figure 10:
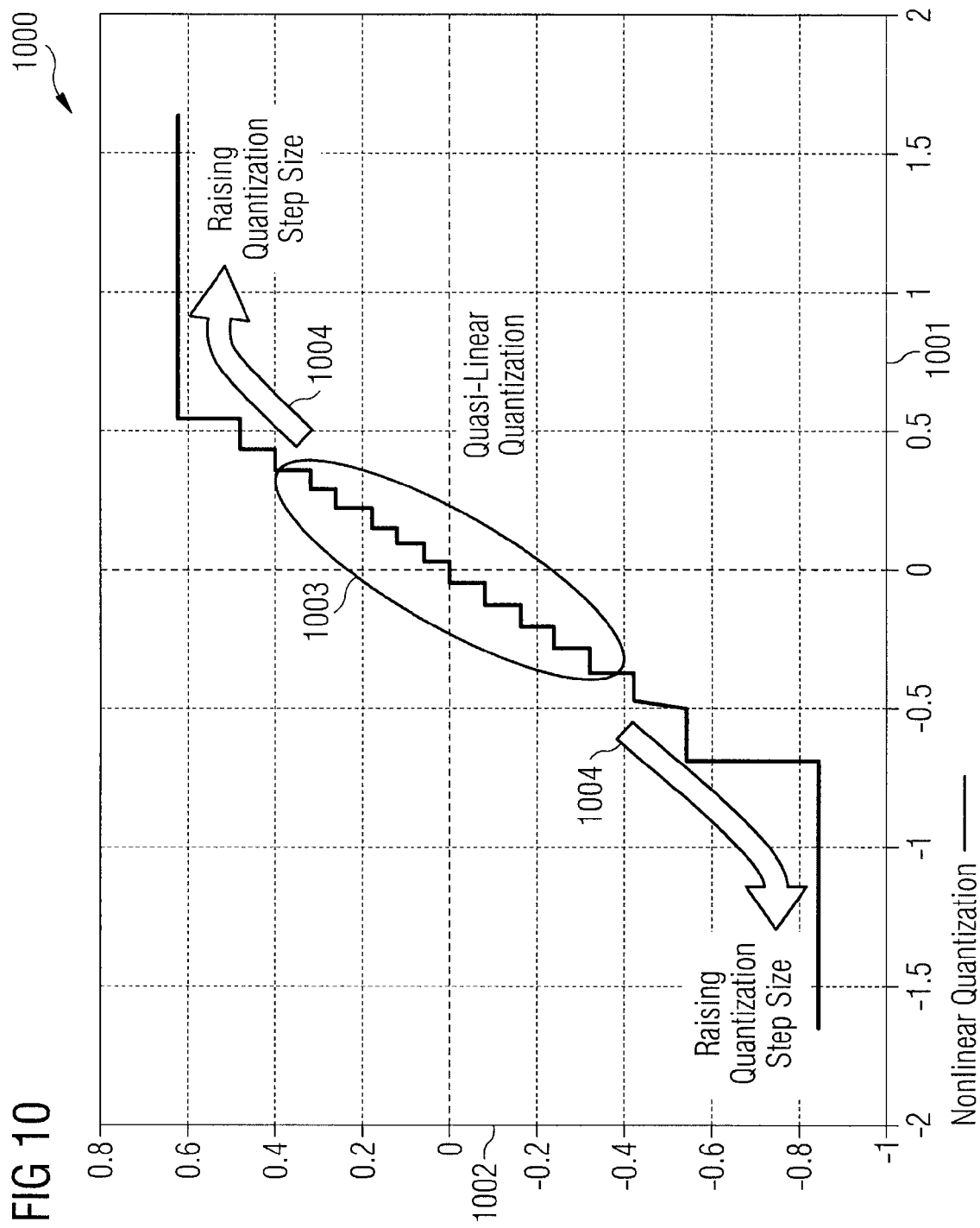
FIG. 10 shows a diagram with the transfer function of a quantizer according to one embodiment.

An example of a quantization according to 1) to 3) above is illustrated in FIG. 10.

FIG. 10 shows a diagram 1000 with the transfer function of a quantizer according to one embodiment. In the diagram 1000, the relationship of input values (illustrated along the x-axis 1001) and output values (illustrated along the y-axis 1002) is shown. For an intermediate value range (around zero), a quasi-linear quantization is used as illustrated by the ellipse 1003. For signal values with larger absolute value than those in the intermediate value range, the quantization step size increases with increasing absolute values of signal values as illustrated by the arrows 1004.

The variable ranges in FIG. 10 are based on an LTE parameterization using 50 resource blocks in frequency domain and with the average power of each used OFDM carrier being '1'. When according to another parameter set the number of used OFDM carriers is changed (e.g. to 6 resource blocks and 110 resource blocks as in FIG. 9), corresponding input/output values may be obtained by multiplying the input/output values of the quantizer illustrated in FIG. 10 by a factor corresponding to the square root of this average power difference factor. In other words, a simple linear relationship between the quantization step sets may be used if the average input power level changes.

According to one embodiment, for example, the quantization steps given in tables 1 to 6 are applied. These values are adapted to the power levels for an LTE uplink signal based on 50 resource blocks. For other power levels the amplitudes given in tables 1 to 6 are linearly scaled e.g. by the factor $$\sqrt{\frac{\text{Number of resource blocks}}{50}}.$$

TABLE 1

8 Non-Linear Quantization Steps
(UL Input Signal [3e−4, 5e−4 Error per Step])

| | |
|---|---|
| X-Step-Amplitudes | −∞, −0.42, −0.24, −0.08, 0.00, 0.06, 0.19, 0.33, 0.51, ∞ |
| Y-Amplitudes | −0.52, −0.32, −0.16, 0.00, 0.12, 0.26, 0.40, 0.62 |

TABLE 2

16 Non-Linear Quantization Steps
(UL Input Signal [4.9e−5, 7e−5 Error per Step])

| | |
|---|---|
| X-Step-Amplitudes | −∞, −0.56, −0.43, −0.34, −0.26, −0.18, −0.10, −0.03, 0.00, 0.03, 0.09, 0.15, 0.22, 0.29, 0.36, 0.44, 0.55, ∞ |
| Y-Amplitudes | −0.64, −0.48, −0.38, −0.30, −0.22, −0.14, −0.06, 0.00, 0.06, 0.12, 0.18, 0.26, 0.32, 0.40, 0.48, 0.62 |

TABLE 3

32 Non-Linear Quantization Steps
(UL Input Signal [1.15e−5, 1.2e−5 Error per Step])

| | |
|---|---|
| X-Step-Amplitudes | −∞, −0.68, −0.56, −0.49, −0.43, −0.38, −0.34, −0.30, −0.26, −0.22, −0.18, −0.14, −0.10, −0.07, −0.04, −0.01, 0.00, 0.01, 0.04, 0.07, 0.10, 0.13, 0.16, 0.20, 0.24, 0.28, 0.32, 0.36, 0.40, 0.45, 0.51, 0.59, 0.81, ∞ |
| Y-Amplitudes | −0.76, −0.60, −0.52, −0.46, −0.40, −0.36, −0.32, −0.28, −0.24, −0.20, −0.16, −0.12, −0.08, −0.06, −0.02, 0.00, 0.02, 0.06, 0.08, 0.12, 0.14, 0.18, 0.22, 0.26, 0.30, 0.34, 0.38, 0.42, 0.48, 0.54, 0.64, 0.98 |

TABLE 4

64 Non-Linear Quantization Steps
(UL Input Signal [10^−6.28, 10^−6.2 Error per Step])

| | |
|---|---|
| X-Step-Amplitudes | −∞ −0.9055, −0.7072, −0.6387, −0.5917, −0.5536, −0.5202, −0.4900, −0.4624, −0.4369, −0.4131, −0.3905, −0.3689, −0.3479, −0.3275, −0.3077, −0.2884, −0.2694, −0.2505, −0.2316, −0.2127, −0.1938, −0.1750, −0.1562, −0.1375, −0.1189, −0.1005, −0.0822, −0.0639, −0.0456, −0.0273, −0.0090, 0.0000, 0.0085, 0.0257, 0.0428, 0.0600, 0.0773, 0.0946, 0.1120, 0.1295, 0.1471, 0.1647, 0.1824, 0.2001, 0.2178, 0.2356, 0.2534, 0.2712, 0.2890, 0.3071, 0.3256, 0.3446, 0.3641, 0.3841, 0.4050, 0.4270, 0.4503, 0.4752, 0.5020, 0.5314, 0.5649, 0.6045, 0.6533, 0.7224, ∞ |

TABLE 4-continued

64 Non-Linear Quantization Steps
(UL Input Signal [$10^{-6.28}$, $10^{-6.2}$ Error per Step])

| | |
|---|---|
| Y-Amplitudes | −1.0614, −0.7496, −0.6648, −0.6126, −0.5708, −0.5364, −0.5040, −0.4760, −0.4488, −0.4250, −0.4012, −0.3798, −0.3580, −0.3378, −0.3172, −0.2982, −0.2786, −0.2602, −0.2408, −0.2224, −0.2030, −0.1846, −0.1654, −0.1470, −0.1280, −0.1098, −0.0912, −0.0732, −0.0546, −0.0366, −0.0180, 0.0000, 0.0170, 0.0344, 0.0512, 0.0688, 0.0858, 0.1034, 0.1206, 0.1384, 0.1558, 0.1736, 0.1912, 0.2090, 0.2266, 0.2446, 0.2622, 0.2802, 0.2978, 0.3164, 0.3348, 0.3544, 0.3738, 0.3944, 0.4156, 0.4384, 0.4622, 0.4882, 0.5158, 0.5470, 0.5828, 0.6262, 0.6804, 0.7644 |

TABLE 5

128 Non-Linear Quantization Steps
(UL Input Signal [$10^{0}$, $10^{-7.125}$ Error per Step])

| | |
|---|---|
| X-Step-Amplitudes | −∞, −0.9102, −0.7767, −0.7184, −0.6784, −0.6471, −0.6213, −0.5990, −0.5790, −0.5606, −0.5434, −0.5271, −0.5116, −0.4968, −0.4827, −0.4692, −0.4562, −0.4437, −0.4316, −0.4199, −0.4085, −0.3974, −0.3866, −0.3760, −0.3655, −0.3552, −0.3450, −0.3350, −0.3251, −0.3154, −0.3058, −0.2963, −0.2869, −0.2776, −0.2683, −0.2590, −0.2497, −0.2404, −0.2311, −0.2218, −0.2125, −0.2032, −0.1940, −0.1848, −0.1756, −0.1664, −0.1572, −0.1480, −0.1388, −0.1296, −0.1205, −0.1115, −0.1025, −0.0936, −0.0847, −0.0758, −0.0669, −0.0580, −0.0491, −0.0402, −0.0313, −0.0223, −0.0133, −0.0044, 0.0000, 0.0043, 0.0130, 0.0217, 0.0304, 0.0391, 0.0478, 0.0565, 0.0652, 0.0739, 0.0826, 0.0913, 0.1001, 0.1089, 0.1177, 0.1265, 0.1354, 0.1443, 0.1532, 0.1621, 0.1711, 0.1800, 0.1889, 0.1979, 0.2069, 0.2159, 0.2249, 0.2339, 0.2429, 0.2519, 0.2609, 0.2699, 0.2789, 0.2879, 0.2970, 0.3062, 0.3155, 0.3249, 0.3344, 0.3441, 0.3539, 0.3638, 0.3739, 0.3841, 0.3945, 0.4052, 0.4162, 0.4275, 0.4392, 0.4512, 0.4636, 0.4765, 0.4899, 0.5038, 0.5184, 0.5338, 0.5503, 0.5681, 0.5876, 0.6090, 0.6327, 0.6597, 0.6917, 0.7334, 0.8018, ∞ |
| Y-Amplitudes | −1.0082, −0.8122, −0.7412, −0.6956, −0.6612, −0.6330, −0.6096, −0.5884, −0.5696, −0.5516, −0.5352, −0.5190, −0.5042, −0.4894, −0.4760, −0.4624, −0.4500, −0.4374, −0.4258, −0.4140, −0.4030, −0.3918, −0.3814, −0.3706, −0.3604, −0.3500, −0.3400, −0.3300, −0.3202, −0.3106, −0.3010, −0.2916, −0.2822, −0.2730, −0.2636, −0.2544, −0.2450, −0.2358, −0.2264, −0.2172, −0.2078, −0.1986, −0.1894, −0.1802, −0.1710, −0.1618, −0.1526, −0.1434, −0.1342, −0.1250, −0.1160, −0.1070, −0.0980, −0.0892, −0.0802, −0.0714, −0.0624, −0.0536, −0.0446, −0.0358, −0.0268, −0.0178, −0.0088, 0.0000, 0.0086, 0.0174, 0.0260, 0.0348, 0.0434, 0.0522, 0.0608, 0.0696, 0.0782, 0.0870, 0.0956, 0.1046, 0.1132, 0.1222, 0.1308, 0.1400, 0.1486, 0.1578, 0.1664, 0.1758, 0.1842, 0.1936, 0.2022, 0.2116, 0.2202, 0.2296, 0.2382, 0.2476, 0.2562, 0.2656, 0.2742, 0.2836, 0.2922, 0.3018, 0.3106, 0.3204, 0.3294, 0.3394, 0.3488, 0.3590, 0.3686, 0.3792, 0.3890, 0.4000, 0.4104, 0.4220, 0.4330, 0.4454, 0.4570, 0.4702, 0.4828, 0.4970, 0.5106, 0.5262, 0.5414, 0.5592, 0.5770, 0.5982, 0.6198, 0.6456, 0.6738, 0.7096, 0.7572, 0.8464 |

TABLE 6

256 Non-Linear Quantization Steps
(UL Input Signal [$10^{-8.06}$, $10^{-8.033}$ Error per Step])

| | |
|---|---|
| X-Step-Amplitudes | −∞, −0.9145, −0.8353, −0.7875, −0.7529, −0.7260, −0.7038, −0.6845, −0.6674, −0.6522, −0.6384, −0.6258, −0.6141, −0.6031, −0.5927, −0.5828, −0.5733, −0.5642, −0.5554, −0.5469, −0.5386, −0.5305, −0.5226, −0.5149, −0.5074, −0.5001, −0.4929, −0.4859, −0.4790, −0.4723, −0.4657, −0.4593, −0.4530, −0.4468, −0.4407, −0.4347, −0.4288, −0.4230, −0.4173, −0.4117, −0.4061, −0.4006, −0.3952, −0.3898, −0.3845, −0.3792, −0.3740, −0.3688, −0.3636, −0.3585, −0.3534, −0.3484, −0.3434, −0.3384, −0.3335, −0.3286, −0.3237, −0.3189, −0.3141, −0.3093, −0.3046, −0.2999, −0.2952, −0.2905, −0.2859, −0.2813, −0.2767, −0.2721, −0.2675, −0.2629, −0.2583, −0.2537, −0.2491, −0.2445, −0.2399, −0.2353, −0.2307, −0.2261, −0.2215, −0.2169, −0.2123, −0.2077, −0.2031, −0.1985, −0.1939, −0.1893, −0.1847, −0.1801, −0.1755, −0.1709, −0.1663, −0.1617, −0.1571, −0.1525, −0.1479, −0.1433, −0.1388, −0.1343, −0.1298, −0.1253, |

TABLE 6-continued

256 Non-Linear Quantization Steps
(UL Input Signal [10^−8.06, 10^−8.033 Error per Step])

|  |  |
|---|---|
|  | −0.1209, −0.1165, −0.1121, −0.1077, −0.1033, −0.0989, −0.0945, −0.0901, −0.0857, −0.0813, −0.0769, −0.0725, −0.0681, −0.0637, −0.0593, −0.0549, −0.0505, −0.0461, −0.0417, −0.0373, −0.0329, −0.0285, −0.0240, −0.0196, −0.0152, −0.0108, −0.0064, −0.0021, 0.0000, 0.0021, 0.0063, 0.0106, 0.0149, 0.0192, 0.0235, 0.0278, 0.0321, 0.0364, 0.0407, 0.0450, 0.0493, 0.0536, 0.0579, 0.0622, 0.0665, 0.0708, 0.0751, 0.0794, 0.0837, 0.0880, 0.0923, 0.0966, 0.1009, 0.1052, 0.1095, 0.1138, 0.1181, 0.1224, 0.1268, 0.1312, 0.1356, 0.1401, 0.1445, 0.1489, 0.1534, 0.1579, 0.1624, 0.1669, 0.1714, 0.1759, 0.1804, 0.1849, 0.1894, 0.1939, 0.1984, 0.2029, 0.2074, 0.2119, 0.2164, 0.2209, 0.2254, 0.2299, 0.2344, 0.2389, 0.2434, 0.2479, 0.2524, 0.2569, 0.2614, 0.2659, 0.2704, 0.2749, 0.2794, 0.2839, 0.2884, 0.2929, 0.2975, 0.3021, 0.3067, 0.3113, 0.3160, 0.3207, 0.3254, 0.3302, 0.3350, 0.3398, 0.3447, 0.3496, 0.3545, 0.3594, 0.3644, 0.3694, 0.3744, 0.3795, 0.3846, 0.3898, 0.3951, 0.4004, 0.4058, 0.4113, 0.4168, 0.4224, 0.4281, 0.4339, 0.4398, 0.4458, 0.4519, 0.4581, 0.4644, 0.4708, 0.4773, 0.4839, 0.4907, 0.4976, 0.5047, 0.5119, 0.5193, 0.5269, 0.5348, 0.5429, 0.5513, 0.5601, 0.5692, 0.5788, 0.5888, 0.5993, 0.6103, 0.6219, 0.6342, 0.6473, 0.6614, 0.6767, 0.6937, 0.7129, 0.7358, 0.7658, 0.8057, 0.8625, ∞ |
| Y-Amplitudes | −0.9658, −0.8632, −0.8074, −0.7676, −0.7382, −0.7138, −0.6938, −0.6752, −0.6596, −0.6448, −0.6320, −0.6196, −0.6086, −0.5976, −0.5878, −0.5778, −0.5688, −0.5596, −0.5512, −0.5426, −0.5346, −0.5264, −0.5188, −0.5110, −0.5038, −0.4964, −0.4894, −0.4824, −0.4756, −0.4690, −0.4624, −0.4562, −0.4498, −0.4438, −0.4376, −0.4318, −0.4258, −0.4202, −0.4144, −0.4090, −0.4032, −0.3980, −0.3924, −0.3872, −0.3818, −0.3766, −0.3714, −0.3662, −0.3610, −0.3560, −0.3508, −0.3460, −0.3408, −0.3360, −0.3310, −0.3262, −0.3212, −0.3166, −0.3116, −0.3070, −0.3022, −0.2976, −0.2928, −0.2882, −0.2836, −0.2790, −0.2744, −0.2698, −0.2652, −0.2606, −0.2560, −0.2514, −0.2468, −0.2422, −0.2376, −0.2330, −0.2284, −0.2238, −0.2192, −0.2146, −0.2100, −0.2054, −0.2008, −0.1962, −0.1916, −0.1870, −0.1824, −0.1778, −0.1732, −0.1686, −0.1640, −0.1594, −0.1548, −0.1502, −0.1456, −0.1410, −0.1366, −0.1320, −0.1276, −0.1230, −0.1188, −0.1142, −0.1100, −0.1054, −0.1012, −0.0966, −0.0924, −0.0878, −0.0836, −0.0790, −0.0748, −0.0702, −0.0660, −0.0614, −0.0572, −0.0526, −0.0484, −0.0438, −0.0396, −0.0350, −0.0308, −0.0262, −0.0218, −0.0174, −0.0130, −0.0086, −0.0042, 0.0000, 0.0042, 0.0084, 0.0128, 0.0170, 0.0214, 0.0256, 0.0300, 0.0342, 0.0386, 0.0428, 0.0472, 0.0514, 0.0558, 0.0600, 0.0644, 0.0686, 0.0730, 0.0772, 0.0816, 0.0858, 0.0902, 0.0944, 0.0988, 0.1030, 0.1074, 0.1116, 0.1160, 0.1202, 0.1246, 0.1290, 0.1334, 0.1378, 0.1424, 0.1466, 0.1512, 0.1556, 0.1602, 0.1646, 0.1692, 0.1736, 0.1782, 0.1826, 0.1872, 0.1916, 0.1962, 0.2006, 0.2052, 0.2096, 0.2142, 0.2186, 0.2232, 0.2276, 0.2322, 0.2366, 0.2412, 0.2456, 0.2502, 0.2546, 0.2592, 0.2636, 0.2682, 0.2726, 0.2772, 0.2816, 0.2862, 0.2906, 0.2952, 0.2998, 0.3044, 0.3090, 0.3136, 0.3184, 0.3230, 0.3278, 0.3326, 0.3374, 0.3422, 0.3472, 0.3520, 0.3570, 0.3618, 0.3670, 0.3718, 0.3770, 0.3820, 0.3872, 0.3924, 0.3978, 0.4030, 0.4086, 0.4140, 0.4196, 0.4252, 0.4310, 0.4368, 0.4428, 0.4488, 0.4550, 0.4612, 0.4676, 0.4740, 0.4806, 0.4872, 0.4942, 0.5010, 0.5084, 0.5154, 0.5232, 0.5306, 0.5390, 0.5468, 0.5558, 0.5644, 0.5740, 0.5836, 0.5940, 0.6046, 0.6160, 0.6278, 0.6406, 0.6540, 0.6688, 0.6846, 0.7028, 0.7230, 0.7486, 0.7830, 0.8284, 0.8966 |

The performance of the quantization as illustrated in FIG. 10 is shown in table 7 in comparison with a linear quantization by a comparison of the average quantization error.

TABLE 7

| Number of Quantization Steps | Average Error of Quantization according to FIG. 10 | (Standard) Linear Quantization Average Error | Improved Error Performance for Non-Linear Quantization |
|---|---|---|---|
| 32 (5 effective bits) | −27.038 dB | −26.790 dB | 0.248 dB |
| 64 (6 effective bits) | −33.089 dB | −32.152 dB | 0.937 dB |
| 128 (7 effective bits) | −39.112 dB | −37.681 dB | 1.431 dB |
| 256 (8 effective bits) | −45.119 dB | −43.265 dB | 1.854 dB |

It should be noted that the performance difference between the quantization according to FIG. 10 and the linear quantization rises with the number of quantization steps. For a higher number of effective bits (or quantization steps), this difference can lead to the reduction of the converter precision by 1 bit and thus may be used for a considerable reduction of the power consumption. The reason for this behaviour may be seen in that i) for small number of quantization steps, all steps are used (for both quantization approaches) for the amplitudes that occur often, all others are in the saturation range; thus the difference between both quantization approaches is small and ii) for higher numbers of quantization steps, these are used more efficiently on the amplitudes that occur less often and thus the performance difference rises.

According to one embodiment, the following methodology is used for finding (optimum) quantization steps adapted to the UL signal. It is based on an iterative process and applicable to any type of signal distribution in general.

According to this process 1) the quantization amplitude of near-zero signals is guaranteed to be zero (this may be important, for example, for the time synchronization which is typically based on a correlator and a DC-offset introduced by a non-zero quantization amplitude for very small input signals can lead to a degradation of the synchronization precision and efficiency), and 2) the quantization step size is (optimally) adjusted to the given signal distribution under the upper mentioned constraints.

Figure 11:
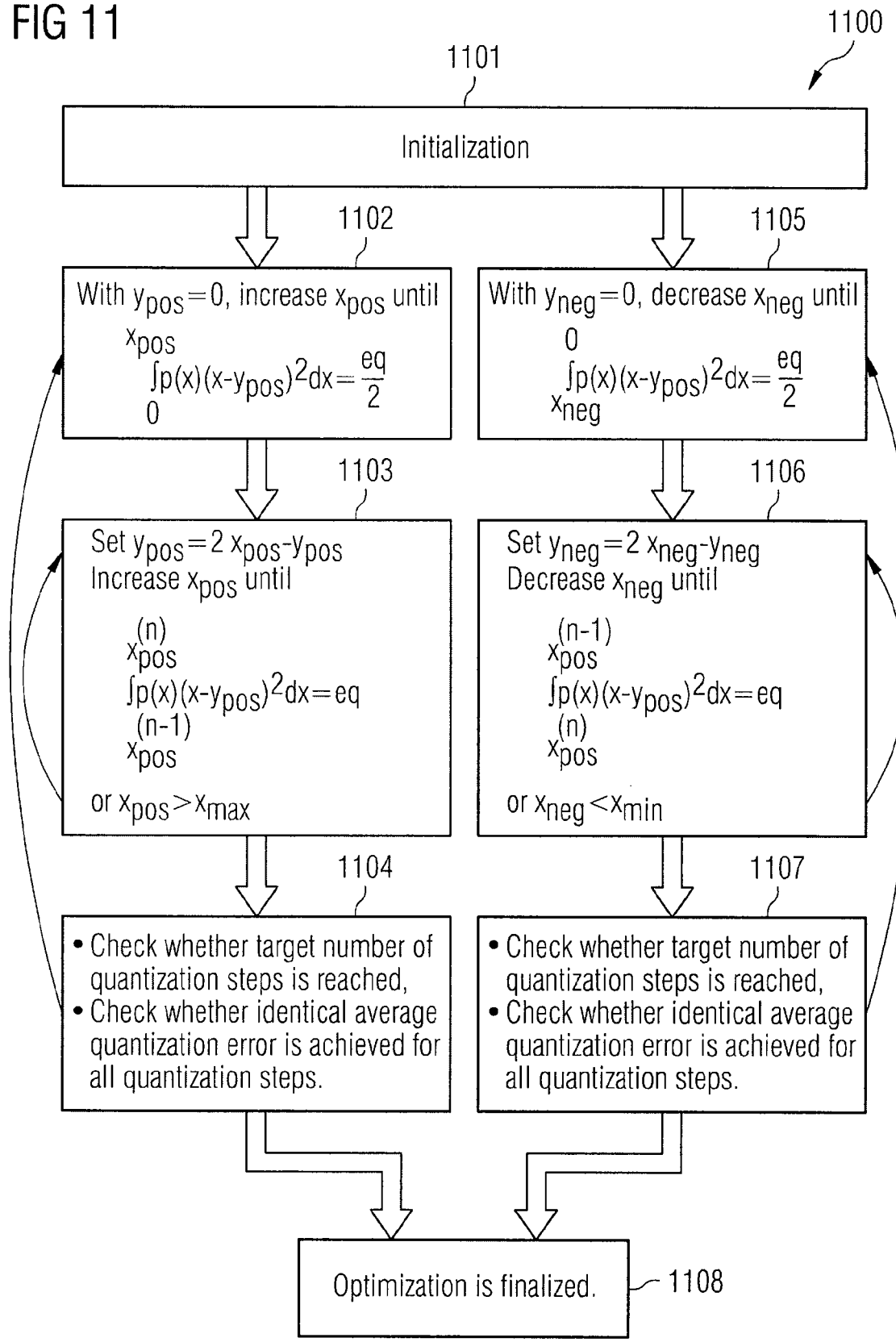
FIG. 11 shows a flow diagram according to an embodiment.

FIG. 11 shows a flow diagram 1100 according to an embodiment. The flow diagram 1100 illustrates a method for setting quantization steps according to an embodiment.

In 1101, some initializations are performed:

Set target number of quantization steps 'N=$2^M$' with M integer,

Set initial quantization error '$e_q$' to be achieved per quantization step ("best guess"), Set initial input variables for positive and negative value ranges to $x_{pos}$=0 and $x_{neg}$=0 as well as the corresponding quantization outputs $y_{pos}$=0, $y_{neg}$=0, Set minimum and maximum input amplitudes to be considered (with the corresponding PDF 'p(x)' being approx. zero): $x_{max}$, $x_{min}$.

In 1102, with $y_{pos}$=0, increase $x_{pos}$ until average quantization error fulfils $$\int_0^{x_{pos}} p(x)(x - y_{pos})^2 dx = \frac{e_q}{2}$$

In 1103, set $y_{pos}$=2 $x_{pos}$−$y_{pos}$ and increase $x_{pos}$ until average quantization error $$\int_{x_{pos}^{(n-1)}}^{x_{pos}^{(n)}} p(x)(x - y_{pos})^2 dx = e_q$$

is obtained or $x_{pos}$>$x_{max}$ 1103 is iterated while $x_{pos}$<$x_{max}$.

In 1104, it is checked whether the target number of quantization steps is reached and whether identical average quantization error is achieved for all quantization steps.

If these two objectives are not met, $e_q$ is updated and the process returns to 1102. Otherwise, the process finishes in 1108.

In 1105, with $y_{neg}$=0, decrease $x_{neg}$ until average quantization error fulfils $$\int_{x_{neg}}^{0} (px)(x - y_{pos})^2 dx = \frac{e_q}{2}.$$

In 1006, set $y_{neg}$=2 $x_{neg}$−$y_{neg}$ and decrease $x_{neg}$ until average quantization error $$\int_{x_{pos}^{(n)}}^{x_{pos}^{(n-1)}} p(x)(x - y_{pos})^2 dx = e_q$$

is obtained or $x_{neg}$<$x_{min}$.

1106 is iterated while $x_{pos}$>$x_{min}$.

In 1107, it is checked whether the target number of quantization steps is reached and whether identical average quantization error is achieved for all quantization steps.

If these two objectives are not met, $e_q$ is updated and the process returns to 11105. Otherwise, the process finishes in 1108.

As an example, it is described in the following how the normalized probability density function of a signal may be approximated by simulation. This is done for the Physical Uplink Shared Channel (PUSC) according to 3GPP LTE. This channel is carrying useful data and has the most sensitive modulation schemes (going from QPSK up to 64QAM). Other channels are for example the Physical Uplink Control Channel (PUCCH) and the Physical Random Access Channel (PRACH).

The following parameters may be considered for the simulation:

Number of subcarriers per resource block: The value is fixed to $N_{SC}^{RB}$=12.

Number of SC-FDMA symbols in an uplink slot, $N_{SC}^{RB}$={6,7}. This value has no impact on the distribution of the modulator outputs and is not considered in the analysis described below.

Constellation type QAM4, QAM16, QAM64. In one embodiment, the quantization optimization is carried out for the highest constellation type supported by a specific implementation, since this is leading to the highest requirements.

The results apply to both the real values and imaginary values of the complex valued time domain signals for the uplink communication. It is assumed that distinct A/D or D/A converters are used for the conversion of the real and imaginary signals respectively. Thus, low conversion frequency rates can be achieved (known as "analogue I/Q approach"). Alternatively, a digital base-band signal of twice (or more) the minimum bandwidth is created such that one single A/D or D/A converter is sufficient ("digital I/Q approach"). The results can straightforwardly be applied to the latter approach as well.

It should be noted that the simulation results are independent of any frequency shift of the considered resource blocks. A frequency shift translates to a simple phase change in time domain which does not impact the distribution of the signals. This means that if distinct users are transmitting signals simultaneously in an uplink configuration, it is expected that each user is applying a frequency shift to his corresponding resource blocks such that the various signals are not interfering. In this case, the quantization optimization may be performed within each handset independently.

The simulation results described below give an approximation of the signal distribution (i.e. the probability distribution of the signal) that is applicable to both real and imaginary components of the signals, i.e. both distributions are identical. Moreover, the results are only given for the positive amplitude values, since exactly the same distribution can be observed for the negative amplitude: f(x)=f(−x) with f(x) being the normalized probability density function. All values given below assume that the power of each used carrier is equal to "1" with a total number of carriers equal to 4096 (which is also the FFT/IFFT size in this example). This means that the higher the number of resource blocks the higher the total power of the signal will get. All simulations are based on data symbols only, preambles and other learning fields are not considered—the reason lies in the fact that the SNR requirements are expected to be higher in the data symbols.

The signal distribution (i.e. the probability distribution of the signal values) may be approximated by a probabilty density function as shown in FIG. 12.

FIG. 12 shows a function graph 1200 according to an embodiment.

Along the x-axis 1201, the signal values are shown. Along the y-axis 1202, the probability according to the approximation is shown. In this example, the approximation is a axis-symmetric piecewise linear function. In a first interval from zero to a first value 1203 (denoted as $A_1$), the probability distribution function (also called normalized probability density function) is constant. In a second interval ranging from the first value 1203 to a second value 1204 (denoted as $A_2$), the probability distribution function is linearly decreasing. The same holds true for a third interval ranging from the second value 1203 to a third value 1205 (denoted as $A_3$). In this example, the probability distribution function decreases more rapidly in the second interval than in the third interval.

The edge values $A_1$, $A_2$, and $A_3$ of the function graph 1200 for different modulation schemes and numbers of recource blocks as obtained from simulation are given in table 8. In table 8, the abbreviations QPSK (Quadrature Phase Shift Keying) and QAM (Quadrature Amplitude Modulation) are used for these modulation techniques.

TABLE 8

| Number of Resource Blocks | QPSK | | | QAM16 | | | QAM64 | | |
|---|---|---|---|---|---|---|---|---|---|
| | A1 | A2 | A3 | A1 | A2 | A3 | A1 | A2 | A3 |
| 6 | 0,1 | 0,2 | 0,300 | 0,05 | 0,2 | 0,300 | 0,03 | 0,2 | 0,300 |
| 7 | 0,1 | 0,25 | 0,300 | 0,05 | 0,25 | 0,300 | 0,03 | 0,25 | 0,300 |
| 8 | 0,11 | 0,25 | 0,325 | 0,05 | 0,25 | 0,325 | 0,03 | 0,25 | 0,325 |
| 9 | 0,12 | 0,275 | 0,350 | 0,06 | 0,275 | 0,350 | 0,04 | 0,275 | 0,350 |
| 10 | 0125 | 0,275 | 0,375 | 0,06 | 0,275 | 0,375 | 0,04 | 0,275 | 0,375 |
| 11 | 0,125 | 0,3 | 0,400 | 0,06 | 0,3 | 0,400 | 0,04 | 0,3 | 0,400 |
| 12 | 0,14 | 0,3 | 0,400 | 0,075 | 0,3 | 0,400 | 0,05 | 0,3 | 0,400 |
| 13 | 0,15 | 0,325 | 0,425 | 0,08 | 0,325 | 0,425 | 0,06 | 0,325 | 0,425 |
| 14 | 0,15 | 0,325 | 0,425 | 0,08 | 0,325 | 0,425 | 0,06 | 0,325 | 0,425 |
| 15 | 0,15 | 0,35 | 0,450 | 0,08 | 0,35 | 0,450 | 0,06 | 0,35 | 0,450 |
| 16 | 0,15 | 0,375 | 0,475 | 0,08 | 0,375 | 0,475 | 0,06 | 0,375 | 0,475 |
| 17 | 0,15 | 0,375 | 0,475 | 0,08 | 0,375 | 0,475 | 0,06 | 0,375 | 0,475 |
| 18 | 0,175 | 0,375 | 0,475 | 0,1 | 0,375 | 0,475 | 0,06 | 0,375 | 0,475 |
| 19 | 0,175 | 0,4 | 0,500 | 0,1 | 0,4 | 0,500 | 0,06 | 0,4 | 0,500 |
| 20 | 0,2 | 0,4 | 0,500 | 0,1 | 0,4 | 0,500 | 0,06 | 0,4 | 0,500 |
| 21 | 0,2 | 0,4 | 0,500 | 0,1 | 0,4 | 0,500 | 0,06 | 0,4 | 0,500 |
| 22 | 0,2 | 0,425 | 0,525 | 0,1 | 0,425 | 0,525 | 0,06 | 0,425 | 0,525 |
| 23 | 0,2 | 0,425 | 0,525 | 0,1 | 0,425 | 0,525 | 0,06 | 0,425 | 0,525 |
| 24 | 0,2 | 0,45 | 0,550 | 0,1 | 0,45 | 0,550 | 0,06 | 0,45 | 0,550 |
| 25 | 0,21 | 0,475 | 0,575 | 0,1 | 0,475 | 0,575 | 0,06 | 0,475 | 0,575 |
| 26 | 0,21 | 0,5 | 0,600 | 0,11 | 0,5 | 0,600 | 0,06 | 0,5 | 0,600 |
| 27 | 0,21 | 0,5 | 0,600 | 0,11 | 0,5 | 0,600 | 0,06 | 0,5 | 0,600 |
| 28 | 0,21 | 0,5 | 0,600 | 0,11 | 0,5 | 0,600 | 0,06 | 0,5 | 0,600 |
| 29 | 0,21 | 0,5 | 0,600 | 0,11 | 0,5 | 0,600 | 0,06 | 0,5 | 0,600 |
| 30 | 0,22 | 0,5 | 0,625 | 0,11 | 0,5 | 0,625 | 0,06 | 0,5 | 0,625 |
| 31 | 0,22 | 0,525 | 0,625 | 0,11 | 0,525 | 0,625 | 0,06 | 0,525 | 0,625 |
| 32 | 0,22 | 0,525 | 0,650 | 0,11 | 0,525 | 0,650 | 0,06 | 0,525 | 0,650 |
| 33 | 0,22 | 0,525 | 0,650 | 0,11 | 0,525 | 0,650 | 0,06 | 0,525 | 0,650 |
| 34 | 0,22 | 0,55 | 0,675 | 0,11 | 0,55 | 0,675 | 0,06 | 0,55 | 0,675 |
| 35 | 0,23 | 0,55 | 0,675 | 0,11 | 0,55 | 0,675 | 0,06 | 0,55 | 0,675 |
| 36 | 0,23 | 0,55 | 0,700 | 0,11 | 0,55 | 0,700 | 0,06 | 0,55 | 0,700 |
| 37 | 0,24 | 0,55 | 0,700 | 0,12 | 0,55 | 0,700 | 0,075 | 0,55 | 0,700 |
| 38 | 0,24 | 0,55 | 0,700 | 0,12 | 0,55 | 0,700 | 0,075 | 0,55 | 0,700 |
| 39 | 0,24 | 0,575 | 0,725 | 0,12 | 0,575 | 0,725 | 0,075 | 0,575 | 0,725 |
| 40 | 0,25 | 0,575 | 0,725 | 0,12 | 0,575 | 0,725 | 0,075 | 0,575 | 0,725 |
| 41 | 0,25 | 0,575 | 0,725 | 0,12 | 0,575 | 0,725 | 0,075 | 0,575 | 0,725 |
| 42 | 0,25 | 0,575 | 0,750 | 0,12 | 0,575 | 0,750 | 0,075 | 0,575 | 0,750 |
| 43 | 0,25 | 0,575 | 0,775 | 0,12 | 0,575 | 0,775 | 0,075 | 0,575 | 0,775 |
| 44 | 0,26 | 0,575 | 0,775 | 0,12 | 0,575 | 0,775 | 0,075 | 0,575 | 0,775 |
| 45 | 0,26 | 0,575 | 0,800 | 0,12 | 0,575 | 0,800 | 0,075 | 0,575 | 0,800 |
| 46 | 0,275 | 0,6 | 0,800 | 0,12 | 0,6 | 0,800 | 0,075 | 0,6 | 0,800 |
| 47 | 0,275 | 0,6 | 0,800 | 0,12 | 0,6 | 0,800 | 0,075 | 0,6 | 0,800 |
| 48 | 0,275 | 0,6 | 0,800 | 0,12 | 0,6 | 0,800 | 0,075 | 0,6 | 0,800 |
| 49 | 0,29 | 0,6 | 0,800 | 0,12 | 0,6 | 0,800 | 0,075 | 0,6 | 0,800 |
| 50 | 0,29 | 0,625 | 0,825 | 0,12 | 0,625 | 0,825 | 0,075 | 0,625 | 0,825 |
| 51 | 0,29 | 0,625 | 0,825 | 0,12 | 0,625 | 0,825 | 0,075 | 0,625 | 0,825 |
| 52 | 0,3 | 0,625 | 0,850 | 0,12 | 0,625 | 0,850 | 0,075 | 0,625 | 0,850 |
| 53 | 0,3 | 0,625 | 0,850 | 0,12 | 0,625 | 0,850 | 0,075 | 0,625 | 0,850 |
| 54 | 0,3 | 0,65 | 0,850 | 0,12 | 0,65 | 0,850 | 0,075 | 0,65 | 0,850 |
| 55 | 0,3 | 0,65 | 0,850 | 0,12 | 0,65 | 0,850 | 0,075 | 0,65 | 0,850 |
| 56 | 0,3 | 0,65 | 0,850 | 0,12 | 0,65 | 0,850 | 0,075 | 0,65 | 0,850 |
| 57 | 0,3 | 0,65 | 0,875 | 0,12 | 0,65 | 0,875 | 0,075 | 0,65 | 0,875 |
| 58 | 0,3 | 0,65 | 0,875 | 0,12 | 0,65 | 0,875 | 0,075 | 0,65 | 0,875 |
| 59 | 0,3 | 0,65 | 0,875 | 0,12 | 0,65 | 0,875 | 0,075 | 0,65 | 0,875 |
| 60 | 0,3 | 0,675 | 0,900 | 0,12 | 0,675 | 0,900 | 0,075 | 0,675 | 0,900 |
| 61 | 0,3 | 0,675 | 0,900 | 0,13 | 0,675 | 0,900 | 0,075 | 0,675 | 0,900 |
| 62 | 0,3 | 0,675 | 0,900 | 0,13 | 0,675 | 0,900 | 0,085 | 0,675 | 0,900 |
| 63 | 0,3 | 0,7 | 0,925 | 0,13 | 0,7 | 0,925 | 0,085 | 0,7 | 0,925 |
| 64 | 0,3 | 0,7 | 0,925 | 0,14 | 0,7 | 0,925 | 0,085 | 0,7 | 0,925 |
| 65 | 0,3 | 0,7 | 0,950 | 0,14 | 0,7 | 0,950 | 0,085 | 0,7 | 0,950 |
| 66 | 0,3 | 0,7 | 0,950 | 0,14 | 0,7 | 0,950 | 0,085 | 0,7 | 0,950 |
| 67 | 0,3 | 0,7 | 0,975 | 0,14 | 0,7 | 0,975 | 0,085 | 0,7 | 0,975 |
| 68 | 0,32 | 0,7 | 0,975 | 0,14 | 0,7 | 0,975 | 0,085 | 0,7 | 0,975 |
| 69 | 0,35 | 0,7 | 0,975 | 0,15 | 0,7 | 0,975 | 0,085 | 0,7 | 0,975 |
| 70 | 0,35 | 0,725 | 0,975 | 0,15 | 0,725 | 0,975 | 0,085 | 0,725 | 0,975 |
| 71 | 0,35 | 0,725 | 0,975 | 0,15 | 0,725 | 0,975 | 0,085 | 0,725 | 0,975 |
| 72 | 0,375 | 0,75 | 0,975 | 0,175 | 0,75 | 0,975 | 0,085 | 0,75 | 0,975 |
| 73 | 0,375 | 0,775 | 1,000 | 0,175 | 0,775 | 1,000 | 0,085 | 0,775 | 1,000 |
| 74 | 0,375 | 0,775 | 1,000 | 0,175 | 0,775 | 1,000 | 0,085 | 0,775 | 1,000 |
| 75 | 0,375 | 0,775 | 1,025 | 0,175 | 0,775 | 1,025 | 0,085 | 0,775 | 1,025 |
| 76 | 0,375 | 0,775 | 1,025 | 0,175 | 0,775 | 1,025 | 0,085 | 0,775 | 1,025 |
| 77 | 0,375 | 0,775 | 1,025 | 0,175 | 0,775 | 1,025 | 0,085 | 0,775 | 1,025 |
| 78 | 0,375 | 0,775 | 1,025 | 0,175 | 0,775 | 1,025 | 0,085 | 0,775 | 1,025 |
| 79 | 0,375 | 0,775 | 1,025 | 0,175 | 0,775 | 1,025 | 0,085 | 0,775 | 1,025 |
| 80 | 0,375 | 0,8 | 1,050 | 0,175 | 0,8 | 1,050 | 0,085 | 0,8 | 1,025 |
| 81 | 0,375 | 0,8 | 1,050 | 0,175 | 0,8 | 1,050 | 0,085 | 0,8 | 1,050 |
| 82 | 0,375 | 0,8 | 1,075 | 0,175 | 0,8 | 1,075 | 0,085 | 0,8 | 1,075 |
| 83 | 0,375 | 0,8 | 1,075 | 0,175 | 0,8 | 1,075 | 0,085 | 0,8 | 1,075 |
| 84 | 0,375 | 0,8 | 1,075 | 0,175 | 0,8 | 1,075 | 0,085 | 0,8 | 1,075 |
| 85 | 0,375 | 0,8 | 1,075 | 0,175 | 0,8 | 1,075 | 0,085 | 0,8 | 1,075 |
| 86 | 0,375 | 0,8 | 1,075 | 0,175 | 0,8 | 1,075 | 0,085 | 0,8 | 1,075 |
| 87 | 0,375 | 0,8 | 1,075 | 0,175 | 0,8 | 1,075 | 0,085 | 0,8 | 1,075 |
| 88 | 0,375 | 0,825 | 1,100 | 0,175 | 0,825 | 1,100 | 0,085 | 0,825 | 1,100 |
| 89 | 0,39 | 0,825 | 1,100 | 0,175 | 0,825 | 1,100 | 0,085 | 0,825 | 1,100 |
| 90 | 0,39 | 0,825 | 1,100 | 0,175 | 0,825 | 1,100 | 0,085 | 0,825 | 1,100 |
| 91 | 0,39 | 0,85 | 1,125 | 0,175 | 0,85 | 1,125 | 0,085 | 0,85 | 1,125 |
| 92 | 0,39 | 0,85 | 1,125 | 0,175 | 0,85 | 1,125 | 0,085 | 0,85 | 1,125 |
| 93 | 0,39 | 0,85 | 1,150 | 0,175 | 0,85 | 1,150 | 0,085 | 0,85 | 1,150 |
| 94 | 0,39 | 0,85 | 1,150 | 0,175 | 0,85 | 1,150 | 0,085 | 0,85 | 1,150 |
| 95 | 0,39 | 0,85 | 1,175 | 0,175 | 0,85 | 1,175 | 0,085 | 0,85 | 1,175 |
| 96 | 0,39 | 0,875 | 1,175 | 0,175 | 0,875 | 1,175 | 0,085 | 0,875 | 1,175 |
| 97 | 0,39 | 0,875 | 1,175 | 0,175 | 0,875 | 1,175 | 0,085 | 0,875 | 1,175 |
| 98 | 0,39 | 0,875 | 1,175 | 0,175 | 0,875 | 1,175 | 0,085 | 0,875 | 1,175 |
| 99 | 0,4 | 0,875 | 1,175 | 0,175 | 0,875 | 1,175 | 0,085 | 0,875 | 1,175 |
| 100 | 0,4 | 0,875 | 1,175 | 0,175 | 0,875 | 1,175 | 0,085 | 0,875 | 1,175 |
| 101 | 0,4 | 0,875 | 1,200 | 0,175 | 0,875 | 1,200 | 0,085 | 0,875 | 1,200 |
| 102 | 0,4 | 0,875 | 1,200 | 0,175 | 0,875 | 1,200 | 0,085 | 0,875 | 1,200 |
| 103 | 0,4 | 0,875 | 1,200 | 0,175 | 0,875 | 1,200 | 0,085 | 0,875 | 1,200 |
| 104 | 0,4 | 0,875 | 1,200 | 0,175 | 0,875 | 1,200 | 0,085 | 0,875 | 1,200 |
| 105 | 0,4 | 0,875 | 1,200 | 0,175 | 0,875 | 1,200 | 0,085 | 0,875 | 1,200 |
| 106 | 0,4 | 0,875 | 1,200 | 0,175 | 0,875 | 1,200 | 0,085 | 0,875 | 1,200 |
| 107 | 0,4 | 0,875 | 1,200 | 0,175 | 0,875 | 1,200 | 0,085 | 0,875 | 1,200 |
| 108 | 0,4 | 0,875 | 1,200 | 0,175 | 0,875 | 1,200 | 0,085 | 0,875 | 1,200 |
| 109 | 0,4 | 0,875 | 1,200 | 0,175 | 0,875 | 1,200 | 0,085 | 0,875 | 1,200 |
| 110 | 0,4 | 0,875 | 1,200 | 0,175 | 0,875 | 1,200 | 0,085 | 0,875 | 1,200 |

The process for generating an approximation of a normalized probability density function of a radio signal such as the one shown in FIG. 12 with for example the parameters of table 8 is illustrated in FIG. 13.

FIG. 13 shows a flow diagram according to an embodiment.

In 1301, points within the chosen constellation type (in this example the QPSK constellation) are randomly selected and mapped onto the carrier grid. Unused carriers are set to 0.

In 1302, preceding, for example according to 3GPP, is performed. This preceding type is typically implemented by a Fast Fourier Transform (FFT). The formula shown in FIG. 13 corresponds to such a precoding according to 3GPP.

Note that the flow illustrated in FIG. 13 relates to the LTE uplink case. For the downlink case, 1302 is omitted.

In 1303, SC-FDMA baseband signal generation (for the uplink case) or OFDM(A) signal generation (for the downlink case) is performed, e.g. according to 3GPP. Note that this precoding type is typically implemented by an Inverse Fast Fourier Transform (IFFT).

The formula shown in FIG. 13 corresponds to such a signal generation according to 3GPP.

In 1304, the statistics of the real values and imaginary values of the complex-valued SC-FDMA signal or OFDM(A) signal, respectively, are updated. The normalized probability density function may be obtained by evaluation of how often the real values and imaginary values are occurring. For this purpose, sufficiently small intervals may be defined over which the real values and imaginary values are assumed to be constant. For each of these intervals, the number of occurances are counted and afterwards suitably normalized such that the true normalized probability density function can be approximated.

The process may be iterated (starting again from 1301) as often as required until the statics are sufficiently exact (i.e. the change of the result is sufficiently small after an iteration).

When generating an optimum quantization for a signal with a certain normalized probability density function, it may be observed that the difference between the optimum solution (that may lead to several dB of mean-square-error performance gain for larger number of quantization steps) and the linear quantization is typically only a fraction of a step size. In one embodiment, a quantization (referred to as pseudo-linear quantization) is therefore used in a first amplitude value range whose quantization steps differ from the quantization steps of a corresponding linear quantization in this range by the size of a quantization step size of the linear quantization at the most.

In one embodiment, the edge values $A_1, A_2, A_3$, are used for setting the signal value range in which such a pseudo-linear quantization is used. For example, the pseudo-linear quantization is used within the signal value range from $-A_1$ to $A_1$, i.e. is used for signal values whose absolute value is at most $A_1$. Concerning the required precision with respect to the "edge approximation" of the normalized probability density function, the edge amplitudes $A_1, A_2, A_3$ are in one embodiment implemented with such a precision such that the amplitude error is smaller than the quantization step width (at the respective amplitude value, i.e. with absolute value $A_1$, $A_2$ or $A_3$, respectively).

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for quantizing of signal values of a signal received or to be transmitted via a radio interface, the method comprising:
   quantizing signal values that lie within a first value range according to a first quantization having a multiplicity of quantization steps wherein the quantization step width between two quantization steps differs from a linear quantization with the same number of quantization steps at most by the step width of the linear quantization with the same number of quantization steps; and
   quantizing signal values that lie within a second value range according to a second quantization having a multiplicity of quantization steps wherein the quantization step width between two quantization steps is larger than the quantization step width between two quantization steps of the first quantization.

2. The method according to claim 1,
   wherein the quantization steps of the first quantization differ from the quantization steps of a linear quantization with the same number of quantization steps at most by the step width of the linear quantization with the same number of quantization steps.

3. The method according to claim 1,
   wherein the absolute values of the signal values in the second value range are larger than the absolute values of the signal values in the first value range.

4. The method according to claim 1,
   wherein the quantization step width of the second quantization increases with increasing absolute values of the signal values in the second value range.

5. The method according to claim 1,
   wherein the first value range is the value range comprising the signal values having absolute values which are at most one third of the absolute value of the largest signal value that is expected.

6. The method according to claim 1,
   wherein the second value range is the value range comprising the signal values having absolute values which are higher than one third of the absolute value of the largest signal value that is expected to be received.

7. The method according to claim 1,
   wherein the definition of the first value range is based on an approximation of the probability distribution function of the signal values of the signal.

8. The method according to claim 1,
   wherein the probability distribution function of the signal values of the signal differ from a piecewise linear approximation of the probability distribution function of the signal values by at most 0.1.

9. The method according to claim 1,
   wherein the probability distribution function of the signal values of the signal differ from a piecewise linear approximation of the probability distribution function of the signal values by at most 0.05.

10. The method according to claim 7,
    wherein the piecewise linear approximation of the probability distribution function is axis-symmetric with respect to the y-axis.

11. The method according to claim 7,
    wherein the first value range is defined such that it corresponds to a value range in which the piecewise linear approximation of the probability distribution function is constant.

12. The method according to claim 8,
wherein the piecewise linear approximation of the probability distribution function is constant in a first interval between 0 and a first positive value, is linearly decreasing in a second interval between a first positive value and a second positive value and is linearly decreasing in a third interval between the second positive value and a third positive value.

13. The method according to claim 12,
wherein the linear decrease in the second interval is more rapid than in the third interval.

14. The method according to claim 12,
wherein the first value range is defined such that it corresponds to the first interval and the mirrored first interval on the negative part of the x-axis.

15. The method according to claim 12,
wherein the second value range is defined such that it corresponds to the second interval, the third interval, the mirrored second interval on the negative part of the x-axis and the mirrored third interval on the negative part of the x-axis.

16. The method according to claim 12,
wherein the ratio between the second positive value and the first positive value is at most 11 and at least 2.

17. The method according to claim 12,
wherein the ratio between the second positive value and the first positive value is at most 10.5.

18. The method according to claim 12,
wherein the ratio between the third positive value and the second positive value is at most 2 and at least 1.2.

19. The method according to claim 12,
wherein the ratio between the third positive value and the second positive value is at most 1.5.

20. A quantizer for quantizing of signal values of a signal received or to be transmitted via a radio interface, the quantizer comprising:
a first quantizing circuit configured to quantize signal values that lie within a first value range according to a first quantization having a multiplicity of quantization steps wherein the quantization step width between two quantization steps differs from a linear quantization with the same number of quantization steps at most by the step width of the linear quantization with the same number of quantization steps; and
a second quantizing circuit quantizing signal values that lie within a second value range according to a second quantization having a multiplicity of quantization steps wherein the quantization step width between two quantization steps is larger than the quantization step width between two quantization steps of the first quantization.

21. The quantizer according to claim 20,
wherein the quantizer is part of an analog-to-digital converter or an digital-to-analog converter in a radio communication device.

22. A method for quantizing of signals received from a communication device or to be transmitted to a communication device, the method comprising:
quantizing a signal to be transmitted to the communication device according to a first quantization,
quantizing a signal received from the communication device according to a second quantization,
wherein the first quantization comprises a quantization step at a signal value at which the second quantization does not a comprise a quantization step and wherein the second quantization comprises a quantization step at a signal value at which the first quantization does not a comprise a quantization step.

23. The method according to claim 20,
wherein the communication device is a mobile terminal or a base station.

24. A quantizer for quantizing of signals received from a communication device or to be transmitted to a communication device, the quantizer comprising:
a first quantizing circuit that is configured to quantize a signal to be transmitted to the communication device according to a first quantization,
a second quantizing circuit that is configured to quantize a signal received from the communication device according to a second quantization,
wherein the first quantization comprises a quantization step at a signal value at which the second quantization does not a comprise a quantization step, and wherein the second quantization comprises a quantization step at a signal value at which the first quantization does not a comprise a quantization step.

25. A method for quantizing of signals received from a communication device or to be transmitted to a communication device, the method comprising:
quantizing signals to be transmitted to the communication device according to a first quantization which is adapted to the probability distribution of the signal values of the signals to be transmitted to the communication device, and quantizing signals received from the communication device according to a second quantization which is adapted to the probability distribution of the signal values of the signals received from the communication device.

* * * * *